United States Patent
Akiyoshi

(10) Patent No.: US 10,559,427 B2
(45) Date of Patent: Feb. 11, 2020

(54) CERAMIC ELECTRONIC COMPONENT AND MOUNT STRUCTURE THEREFOR

(71) Applicant: Murata Manufacturing Co., Ltd., Nagaokakyo-shi, Kyoto-fu (JP)

(72) Inventor: Teppei Akiyoshi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 66 days.

(21) Appl. No.: 16/016,901

(22) Filed: Jun. 25, 2018

(65) Prior Publication Data

US 2018/0374641 A1 Dec. 27, 2018

(30) Foreign Application Priority Data

Jun. 27, 2017 (JP) .................. 2017-125650

(51) Int. Cl.
*H01G 4/232* (2006.01)
*H01G 4/224* (2006.01)
(Continued)

(52) U.S. Cl.
CPC ........... *H01G 4/2325* (2013.01); *H01C 1/014* (2013.01); *H01C 1/028* (2013.01); *H01G 2/06* (2013.01); *H01G 4/224* (2013.01); *H01G 4/232* (2013.01); *H03H 9/1042* (2013.01); *H01G 4/12* (2013.01); *H01G 4/30* (2013.01)

(58) Field of Classification Search
CPC ...... H01G 4/2325; H01G 4/224; H01G 4/232; H01G 2/06; H01G 4/30; H03H 9/1042; H01C 1/028; H01C 1/014

See application file for complete search history.

(56) References Cited

U.S. PATENT DOCUMENTS 3,581,167 A * 5/1971 Veater ............... H01G 2/08
361/321.2
2011/0025450 A1 * 2/2011 Chang .............. H01C 1/028
338/21

(Continued)

FOREIGN PATENT DOCUMENTS

JP 62-084921 U 5/1987
JP 08-293568 A 11/1996
(Continued)

*Primary Examiner* — Eric W Thomas
(74) *Attorney, Agent, or Firm* — Keating & Bennett, LLP

(57) ABSTRACT

A ceramic electronic component includes an electronic component body and portions of first and second metal terminals defined by lead wires covered with an outer resin material. The first metal terminal includes, connected in order, a first terminal joint portion, a first extension portion extending in a direction toward a mounting surface, and a first mount portion extending toward a side opposite to the electronic component body. The second metal terminal includes, connected in order, a second terminal joint portion, a second extension portion extending in the direction toward the mounting surface, and a second mount portion extending toward a side opposite to the electronic component body. The first and second mount portions respectively include first and second protruding bending portions protruding toward the mounting surface. The outer resin material includes a protruding portion protruding toward the mounting surface.

19 Claims, 9 Drawing Sheets

(51) Int. Cl.
  *H01G 2/06* (2006.01)
  *H03H 9/10* (2006.01)
  *H01C 1/028* (2006.01)
  *H01C 1/014* (2006.01)
  H01G 4/30 (2006.01)
  H01G 4/12 (2006.01)

(56) References Cited

U.S. PATENT DOCUMENTS

2011/0274831 A1* 11/2011 Saegusa ............... H01C 1/028
                                                           427/103
2016/0086699 A1*  3/2016 Huang ................. H01C 1/142
                                                           338/21

FOREIGN PATENT DOCUMENTS

| JP | 11-191472 A | 7/1999 |
| JP | 2000-252606 A | 9/2000 |
| JP | 2011091335 A * | 5/2011 |
| JP | 2011096898 A * | 5/2011 |
| JP | 2011-216420 A | 10/2011 |

\* cited by examiner

IV-IV SECTIONAL VIEW

V-V SECTIONAL VIEW

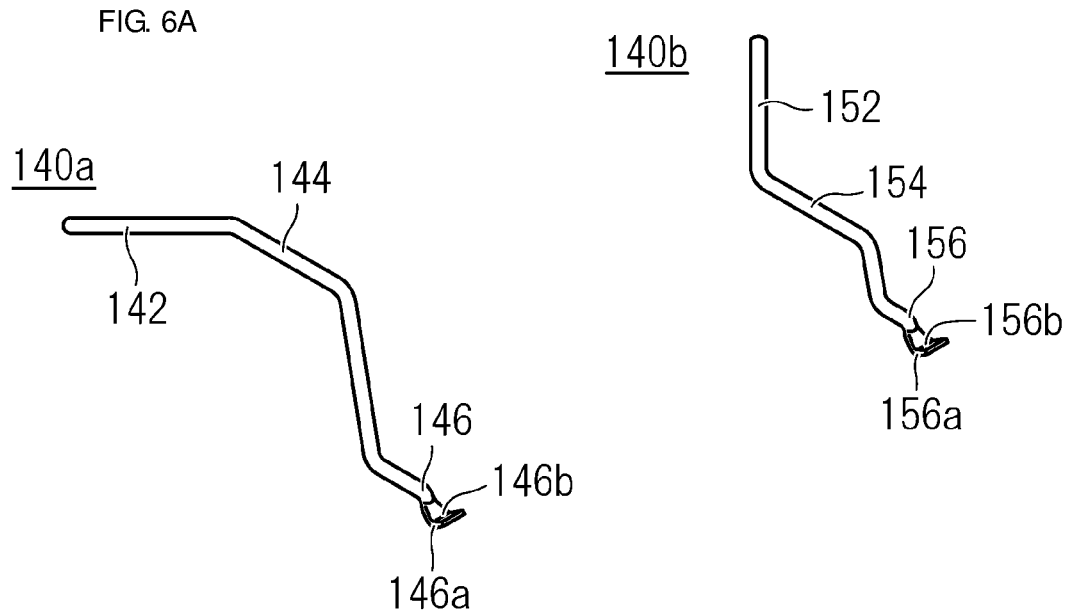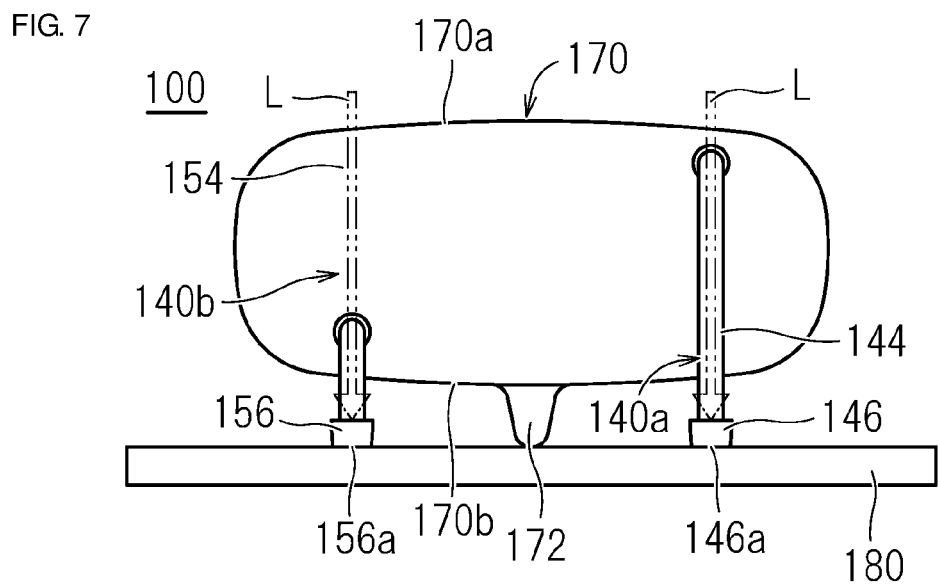

XIII-XIII SECTIONAL VIEW

CERAMIC ELECTRONIC COMPONENT AND MOUNT STRUCTURE THEREFOR

CROSS REFERENCE TO RELATED APPLICATIONS

This application claims the benefit of priority to Japanese Patent Application No. 2017-125650 filed on Jun. 27, 2017. The entire contents of this application are hereby incorporated herein by reference.

BACKGROUND OF THE PRESENT INVENTION

1. Field of the Present Invention

The present invention relates to, for example, a ceramic electronic component including a multilayer ceramic capacitor, and a mount structure for the ceramic electronic component.

2. Description of the Related Art

In an electronic component, such as a resistor, a capacitor, a piezoelectric component, or a semiconductor device, an electronic component element (electronic component body) is coated with thermosetting outer resin to ensure electrical insulating property, and to protect the electronic component element from an outer environment, such as stress, moisture, or heat, as described in, for example, Japanese Unexamined Patent Application Publication No. 62-84921.

Moreover, when an electronic component like one described in Japanese Unexamined Patent Application Publication No. 62-84921 is mounted on a mounting substrate, welding (for example, laser welding as a method capable of decreasing the welding time) is known as a method of mounting a connection terminal on a mount point other than soldering (see Japanese Unexamined Patent Application Publication No. 11-191472).

However, in recent years, an electronic component in which an electronic component element that is used in a high-temperature environment and that is coated with outer resin is used more frequently primarily in the industry of on-vehicle devices. When an electronic component in which an electronic component body is coated with epoxy resin as described in Japanese Unexamined Patent Application Publication No. 62-84921 is used in such a high-temperature environment, the component may detach or fall off due to molten solder for joining on the mounting substrate, or the solder may be fragile because the solder is exposed to high temperatures for a long period even if the temperature is lower than the solder melting temperature. The equivalent series resistance (ESR) may be increased and the adhesion intensity may be decreased by formation of a solder crack. A typical method of avoiding the problems is a method of using solder having a high-temperature melting point. However, there is actually no solder that satisfies the cost, mountability, and performance requirements capable of addressing the above-described problems.

Also, a typical welding mount technology as described in Japanese Unexamined Patent Application Publication No. 11-191472 needs to press the metal to be connected against a portion at which the metal is to be welded, and connect the metal by applying current to the metal in a secure surface-contact state and thus melting the metal. If the technology is applied to the electronic component with the metal terminal as described in Japanese Unexamined Patent Application Publication No. 62-84921, it is necessary to perform the connection by bringing a connection terminal member of the metal terminal member to be mounted securely into surface contact with the mounting surface of the mounting substrate. The connection takes a large amount of time.

In the case in which the laser welding as described in Japanese Unexamined Patent Application Publication No. 11-191472 is applied to the electronic component with the metal terminal as described in Japanese Unexamined Patent Application Publication No. 62-84921, it is a precondition that the connection terminal member of the metal terminal member to be mounted is securely in surface contact with the mounting surface of the mounting substrate. At this time, it is difficult to obtain the state in which the portion subject to welding is securely in contact due to the problems of warpage of the mounting substrate and coplanarity of the electronic component (flatness of component (in the case of the metal terminals, shift between mounting surfaces of left and right metal terminals). The difficulty in the contact may result in welding defects.

Also, the metal terminal member having a metallic luster reflects laser energy, so the metal terminal member cannot be efficiently welded.

Another method of laser welding the electronic component while pressing the electronic component has been considered. However, the speed of laser welding obtained because of the non-contact state cannot be used.

SUMMARY OF THE PRESENT INVENTION

Preferred embodiments of the present invention provide ceramic electronic components each including a metal terminal, and mount structures for the ceramic electronic components, the electronic components being capable of being reliably welded and mounted even when a mounting substrate is warped, connection portions are not in one plane due to a step, and the electronic component has low coplanarity.

According to a preferred embodiment of the present invention, a ceramic electronic component includes an element body including a first main surface and a second main surface that are opposed to one another; an electronic component body including a first outer electrode arranged on the element body, and a second outer electrode arranged on the element body; a first metal terminal connected to the first outer electrode and defined by a lead wire; a second metal terminal connected to the second outer electrode and defined by a lead wire; and an outer resin material that covers the electronic component body, the first and second outer electrodes, a portion of the first metal terminal, and a portion of the second metal terminal. The second main surface of the element body is located on a side near a mounting surface of a mounting substrate on which the ceramic electronic component is to be mounted. The first metal terminal includes a first terminal joint portion that is connected to the first outer electrode, a first extension portion that is connected to the first terminal joint portion and that defines a gap between the electronic component body and the mounting surface of the mounting substrate, and a first mount portion that is connected to the first extension portion and that extends toward a side opposite to the electronic component body. The second metal terminal includes a second terminal joint portion that is connected to the second outer electrode, a second extension portion that is connected to the second terminal joint portion and that defines a gap between the electronic component body and the mounting surface of the mounting substrate, and a second mount portion that is connected to the second extension portion and that extends toward a side opposite to the electronic component body. The outer resin material includes a protruding portion that protrudes toward the mounting surface of the mounting substrate. The first mount portion includes a first protruding bending portion that protrudes toward the mounting surface of the mounting substrate. The second mount portion includes a second protruding bending portion that protrudes toward the mounting surface of the mounting substrate. Vertices of the first protruding bending portion, the second protruding bending portion, and the protruding portion are arranged to contact the mounting surface of the mounting substrate.

In a ceramic electronic component according to a preferred embodiment of the present invention, a height of each of the first protruding bending portion and the second protruding bending portion is preferably in a range from about 0.1 mm to about 1 mm.

In a ceramic electronic component according to a preferred embodiment of the present invention, a surface of each of the first metal terminal and the second metal terminal is preferably coated in black color or oxidized.

According to a preferred embodiment of the present invention, a mount structure for a ceramic electronic component is provided. The ceramic electronic component includes an element body including a first main surface and a second main surface that are opposed to one another; an electronic component body including a first outer electrode arranged on the element body, and a second outer electrode arranged on the element body; a first metal terminal connected to the first outer electrode and defined by a lead wire; a second metal terminal connected to the second outer electrode and defined a lead wire; and an outer resin material that covers the electronic component body, the first and second outer electrodes, a portion of the first metal terminal, and a portion of the second metal terminal. The second main surface of the element body is located on a side near a mounting surface of a mounting substrate on which the ceramic electronic component is to be mounted. The first metal terminal includes a first terminal joint portion that is connected to the first outer electrode, a first extension portion that is connected to the first terminal joint portion and that defines a gap between the electronic component body and the mounting surface of the mounting substrate, and a first mount portion that is connected to the first extension portion and that extends toward a side opposite to the electronic component body. The second metal terminal includes a second terminal joint portion that is connected to the second outer electrode, a second extension portion that is connected to the second terminal joint portion and that defines a gap between the electronic component body and the mounting surface of the mounting substrate, and a second mount portion that is connected to the second extension portion and that extends toward a side opposite to the electronic component body. The outer resin material includes a protruding portion that protrudes toward the mounting surface of the mounting substrate. The first mount portion includes a first protruding bending portion that protrudes toward the mounting surface of the mounting substrate. The second mount portion includes a second protruding bending portion that protrudes toward the mounting surface of the mounting substrate. Vertices of the first protruding bending portion and the second protruding bending portion are joined to the mounting surface of the mounting substrate. The joining is performed by welding to the mounting surface of the mounting substrate from a first recessed bending portion on a side opposite to the mounting surface of the mounting substrate at a position of the first protruding bending portion. The joining is performed by welding to the mounting surface of the mounting substrate from a second recessed bending portion on a side opposite to the mounting surface of the mounting substrate at a position of the second protruding bending portion.

In a mount structure for the ceramic electronic component according to a preferred embodiment of the present invention, the joining by welding is preferably joining by laser welding that is performed by irradiating the first recessed bending portion and the second recessed bending portion with laser beams.

With preferred embodiments of the present invention, ceramic electronic components each including a metal terminal, and mount structures for the ceramic electronic components are provided, the electronic components being capable of being reliably welded and mounted even when a mounting substrate is warped, connection portions are not in one plane due to a step, and the electronic component has low coplanarity.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 6A and 6B are external perspective views illustrating metal terminals included in the ceramic electronic component according to the first preferred embodiment of the present invention, FIG. 6A illustrating a first metal terminal, FIG. 6B illustrating a second metal terminal.

FIG. 7 is a schematic configuration diagram illustrating a state of a mount structure for the ceramic electronic component according to the first preferred embodiment of the present invention.

DETAILED DESCRIPTION OF THE PREFERRED EMBODIMENTS

First Preferred Embodiment

Figure 1:
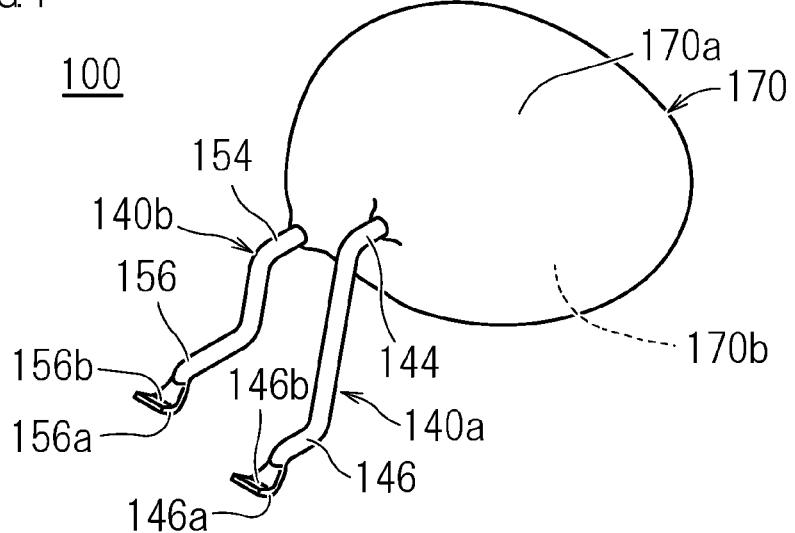
FIG. 1 is an external perspective view illustrating an example of a ceramic electronic component according to a first preferred embodiment of the present invention.
Figure 2:
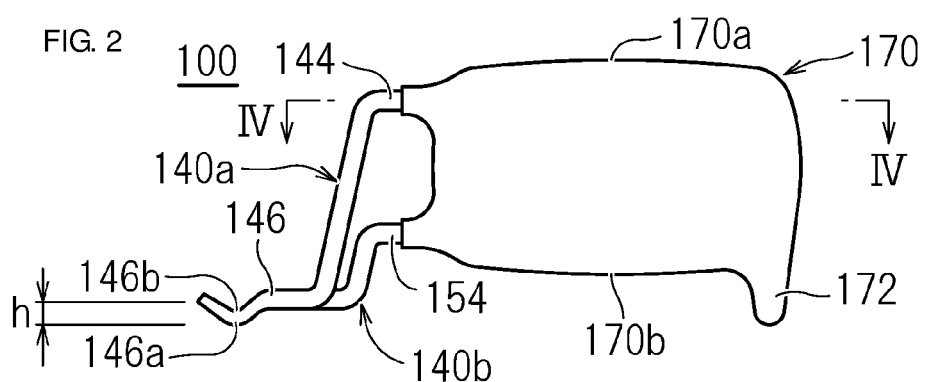
FIG. 2 is a side view illustrating the example of the ceramic electronic component according to the first preferred embodiment of the present invention.
Figure 3:
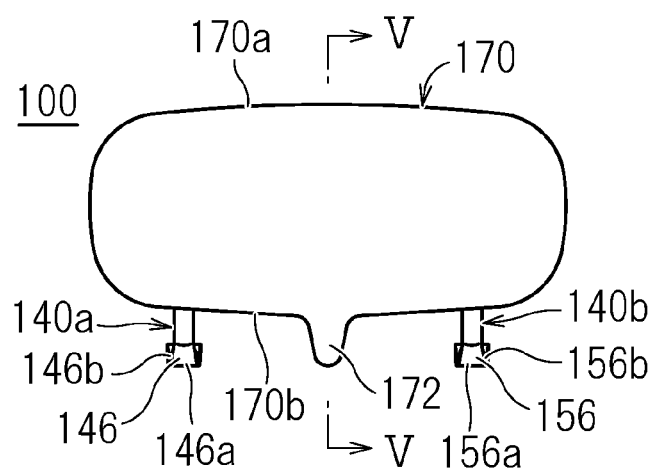
FIG. 3 is a front view illustrating the example of the ceramic electronic component according to the first preferred embodiment of the present invention.
Figure 4:
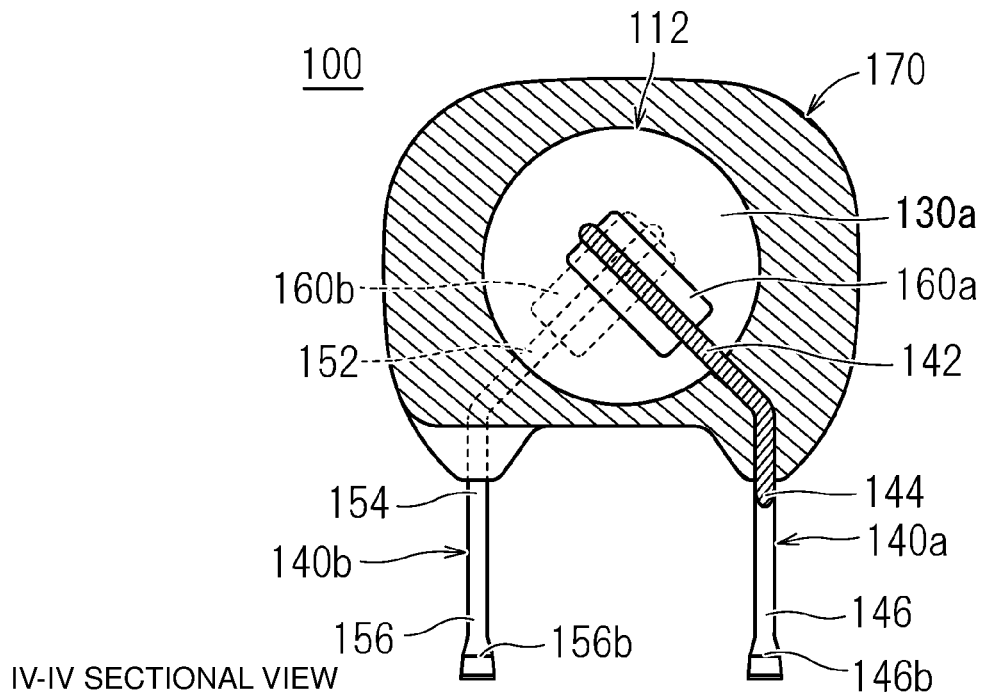
FIG. 4 is a sectional view taken along line IV-IV of FIG. 2, illustrating the ceramic electronic component according to the first preferred embodiment of the present invention.
Figure 5:
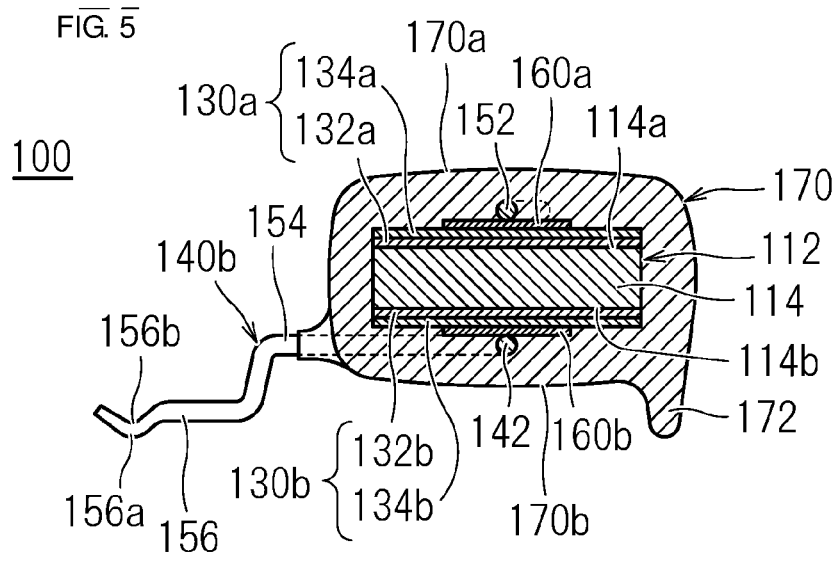
FIG. 5 is a sectional view taken along line V-V of FIG. 3, illustrating the ceramic electronic component according to the first preferred embodiment of the present invention.

A ceramic electronic component according to a first preferred embodiment of the present invention is described. FIG. 1 is an external perspective view illustrating an example of the ceramic electronic component according to the first preferred embodiment of the present invention. FIG. 2 is a side view illustrating the example of the ceramic electronic component according to the first preferred embodiment of the present invention. FIG. 3 is a front view illustrating the example of the ceramic electronic component according to the first preferred embodiment of the present invention. FIG. 4 is a sectional view taken along line IV-IV of FIG. 2, illustrating the ceramic electronic component according to the first preferred embodiment of the present invention. FIG. 5 is a sectional view taken along line V-V of FIG. 3, illustrating the ceramic electronic component according to the first preferred embodiment of the present invention. FIGS. 6A and 6B are external perspective views illustrating metal terminals included in the ceramic electronic component according to the first preferred embodiment of the present invention, FIG. 6A illustrating a first metal terminal, FIG. 6B illustrating a second metal terminal. FIG. 7 is a schematic configuration diagram illustrating a state of a mount structure for the ceramic electronic component according to the first preferred embodiment of the present invention.

A ceramic electronic component 100 according to the first preferred embodiment of the present invention includes, for example, an electronic component body 112, and two metal terminals including a first metal terminal 140a and a second metal terminal 140b. The electronic component body 112 is connected to the first metal terminal 140a via a first joint material 160a. The electronic component body 112 is connected to the second metal terminal 140b via a second joint material 160b. Also, the ceramic electronic component 100 includes an outer resin material 170 that covers the electronic component body 112, at least a portion of the first metal terminal 140a, and at least a portion of the second metal terminal 140b.

The electronic component body 112 includes an element body 114. The element body 114 is preferably made of a single-plate ceramic plate, and has a circular or substantially circular plate shape (disk shape or substantially disk shape), for example. The element body 114 includes a first main surface 114a and a second main surface 114b that are opposed to one another, and a side surface 114c that connects the first main surface 114a and the second main surface 114b.

The material of the ceramic plate may preferably be dielectric ceramics including, for example, barium titanate ($BaTiO_3$), calcium titanate ($CaTiO_3$), strontium titanate ($SrTiO_3$), or calcium zirconate ($CaZrO_3$), as a main component. Also, a sub-component, such as a manganese (Mn) compound, a magnesium (Mg) compound, a silicon (Si) compound, a cobalt (Co) compound, or a nickel (Ni) compound, may be added to the main component, and the resultant may be used as the material of the ceramic plate. Alternatively, piezoelectric ceramics, such as PZT-based ceramics, or semiconductor ceramics, such as spinel-based ceramics may be used.

Since the element body 114 includes dielectric ceramics, the element body 114 defines and functions as a capacitor. When the element body 114 includes piezoelectric ceramics, the element body 114 defines and functions as a piezoelectric component. When the element body 114 includes semiconductor ceramics, the element body 114 defines and functions as a thermistor.

The outer diameter dimension of the element body 114 is not particularly limited. However, the diameter of the element body 114 is preferably in a range from about 3.0 mm to about 6.0 mm, for example. Thus, the electronic component body 112 is able to be reduced in size.

The thickness of the element body 114 is not particularly limited. However, the thickness of the element body 114 is preferably in a range from about 0.8 mm to about 1.2 mm, for example. Thus, the electronic component body 112 is able to be reduced in height.

Outer electrodes 130 are provided on the first main surface 114a and the second main surface 114b of the element body 114. The outer electrodes 130 include a first outer electrode 130a and a second outer electrode 130b.

The first outer electrode 130a is provided on a surface of the first main surface 114a of the element body 114. The second outer electrode 130b is provided on a surface of the second main surface 114b of the element body 114.

As illustrated in FIG. 5, the first outer electrode 130a includes, in the order from the element body 114 side, a first underlying electrode layer 132a, and a first plated layer 134a provided on a surface of the first underlying electrode layer 132a. Similarly, the second outer electrode 130b includes, in the order from the element body 114 side, a second underlying electrode layer 132b, and a second plated layer 134b provided on a surface of the second underlying electrode layer 132b.

The first underlying electrode layer 132a is provided on the first main surface 114a of the element body 114.

The second underlying electrode layer 132b is provided on the second main surface 114b of the element body 114.

The first underlying electrode layer 132a and the second underlying electrode layer 132b (hereinafter, also merely referred to as underlying electrode layer) each preferably include, for example at least one selected from a baked layer, a thin-film layer, and other layers. In this case, the first underlying electrode layer 132a and the second underlying electrode layer 132b that are baked layers are described.

The baked layer preferably includes glass and metal, for example. The metal of the baked layer preferably includes, for example, at least one selected from copper (Cu), Ni, silver (Ag), palladium (Pd), an Ag—Pd alloy, gold (Au), and other metal materials. The glass of the baked layer preferably includes, for example, at least one selected from Si, Pd, lithium (Li), sodium (Na), potassium (K), and other glass materials. The baked layer may include a plurality of baked layers. The baked layer is formed by applying conductive paste including glass and metal on the element body 114 and baking the conductive paste. The baked layer may be formed by firing the paste simultaneously with the ceramic plate, or by baking the paste after the ceramic plate is fired. The thickness of the thickest portion of the baked layer is preferably in a range from about 10 μm to about 50 μm, for example.

A resin layer including conductive particles and thermosetting resin may be provided on a surface of the baked layer. Alternatively, the resin layer may be directly provided on the element body 114 without providing the baked layer. The resin layer may include a plurality of resin layers. The thickness of the thickest portion of the resin layer is preferably in a range from about 20 μm to about 150 μm, for example.

The thin-film layer is formed by a method of forming a thin film, such as sputtering or vapor deposition, and is a layer preferably having a thickness of about 1 μm or smaller, for example, in which metal particles are deposited.

The first plated layer 134a is provided on the surface of the first underlying electrode layer 132a to cover the first underlying electrode layer 132a. Similarly, the second plated layer 134b is provided on the surface of the second underlying electrode layer 132b to cover the second underlying electrode layer 132b.

The first plated layer 134a and the second plated layer 134b (hereinafter, also merely referred to as plated layer) include, for example, at least one kind of metal selected from Cu, Ni, tin (Sn), Ag, Pd, an Ag—Pd alloy, Au, and other metal materials, or an alloy including the metal.

The plated layer may include a plurality of layers. In this case, the plated layer preferably has a two-layer structure including a Ni-plated layer and a Sn-plated layer, for example. By providing the Ni-plated layer to cover the surface of the underlying electrode layer, the Ni-plated layer prevents the underlying electrode layer from being eroded by solder when the first metal terminal 140a and the second metal terminal 140b are joined. By providing the Sn-plated layer on the surface of the Ni-plated layer, when the multilayer ceramic capacitor is mounted, the wettability of the solder used for the mounting is increased and the mounting is easily performed.

The thickness of the single plated layer is preferably in a range from about 1 μm to about 10 μm, for example.

Preferably, the plated layer does not include glass. Preferably, the ratio of metal of the plated layer per unit volume is about 99% by volume or more, for example.

Next, a case in which the first underlying electrode layer 132a and the second underlying electrode layer 132b are defined by plated electrodes is described. The first underlying electrode layer 132a is defined by a plated layer, and is directly provided on the surface of the first main surface 114a of the element body 114.

The second underlying electrode layer 132b is defined by a plated layer, and is directly provided on the surface of the second main surface 114b of the element body 114.

To enable the first underlying electrode layer 132a and the second underlying electrode layer 132b to be defined by the plated layers, a catalyst is provided on the element body 114 for pre-processing.

The first underlying electrode layer 132a defined by the plated layer is preferably covered with the first plated layer 134a. Similarly, the second underlying electrode layer 132b defined by the plated layer is preferably covered with the second plated layer 134b.

The first underlying electrode layer 132a and the second underlying electrode layer 132b, and the first plated layer 134a and the second plated layer 134b preferably include, for example, one metal selected from Cu, Ni, Sn, lead (Pb), Au, Ag, Pd, bismuth (Bi), and zinc (Zn), or an alloy including the metal.

The first plated layer 134a and the second plated layer 134b are provided as necessary. The first outer electrode 130a may include only the first underlying electrode layer 132a, and the second outer electrode 130b may include only the second underlying electrode layer 132b. Alternatively, the first plated layer 134a and the second plated layer 134b may be provided as the outermost layers of the first outer electrode 130a and the second outer electrode 130b, or another plated layer may be provided on the first plated layer 134a or the second plated layer 134b.

The thickness of the single plated layer is preferably in a range from about 1 μm to about 15 μm, for example. Preferably, the plated layer does not include glass. Preferably, the ratio of metal of the plated layer per unit volume is about 99% by volume or more, for example. The first underlying electrode layer 132a and the second underlying electrode layer 132b, and the first plated layer 134a and the second plated layer 134b defined by the plated layers are preferably further plated by grain growth in the thickness direction, and have a columnar or substantially columnar shape.

The plated layers may be directly provided on the surfaces of the element body 114 without the first underlying electrode layer 132a and the second underlying electrode layer 132b. When the plated layers are directly provided on the element body 114, the plated layers are preferably made of, for example, at least one metal selected from Cu, Ni, Sn, Pb, Au, Ag, Pd, Bi, and Zn, or an alloy including the metal.

Metal terminals include the first metal terminal 140a and the second metal terminal 140b.

The first metal terminal 140a and the second metal terminal 140b are provided to mount the ceramic electronic component 100 on the mounting substrate.

The first metal terminal 140a is connected to the first outer electrode 130a of the electronic component body 112 via the first joint material 160a.

The second metal terminal 140b is connected to the second outer electrode 130b of the electronic component body 112 via the second joint material 160b.

The first metal terminal 140a is preferably defined by a lead wire having a circular or substantially circular cross section, for example. The first metal terminal 140a includes a first terminal joint portion 142 that is connected to the first outer electrode 130a, a first extension portion 144 that is connected to the first terminal joint portion 142 and that defines a gap between the second main surface 114b of the ceramic electronic component 100 and the mounting surface of the mounting substrate, in a direction toward the mounting surface, and a first mount portion 146 that is connected to the first extension portion 144 and that extends toward a side opposite to the electronic component body 112.

The second metal terminal 140b is preferably defined by a lead wire having a circular or substantially circular cross section, for example. The second metal terminal 140b include a second terminal joint portion 152 that is connected to the second outer electrode 130b, a second extension portion 154 that is connected to the second terminal joint portion 152 and that defines a gap between the second main surface 114b of the ceramic electronic component 100 and the mounting surface of the mounting substrate, in the direction toward the mounting surface, and a second mount portion 156 that is connected to the second extension portion 154 and that extends toward a side opposite to the electronic component body 112.

The first terminal joint portion 142 of the first metal terminal 140a is connected to the first outer electrode 130a provided on the first main surface 114a of the electronic component body 112 via, for example, the first joint material 160a.

The second terminal joint portion 152 of the second metal terminal 140b is connected to the second outer electrode 130b provided on the second main surface 114b of the electronic component body 112 via, for example, the second joint material 160b.

The first extension portion 144 of the first metal terminal 140a extends from the first terminal joint portion 142, bends at an intermediate portion thereof in the direction toward the mounting surface to define a gap between the second main surface 114b of the electronic component body 112 and the mounting surface of the mounting substrate, and extends. The second extension portion 154 of the second metal terminal 140b extends from the second terminal joint portion 152, bends at an intermediate portion thereof in the direction toward the mounting surface to define a gap between the second main surface 114b of the electronic component body 112 and the mounting surface of the mounting substrate, and extends.

The first extension portion 144 of the first metal terminal 140a, and the second extension portion 154 of the second metal terminal 140b lift the electronic component body 112 so as to be spaced away from the mounting substrate on which the ceramic electronic component 100 is mounted. Accordingly, elastic deformation of the first extension portion 144 and the second extension portion 154 is able to absorb, for example, a stress that is generated due to a difference in thermal expansion coefficient between the mounting substrate and the ceramic electronic component 100, a stress that is generated when the mounting substrate bends, and a mechanical strain that is generated in the ceramic layer when a voltage is applied.

The first mount portion 146 of the first metal terminal 140a is connected to the first extension portion 144 and extends toward a side opposite to the electronic component body 112. The second mount portion 156 of the second metal terminal 140b is connected to the second extension portion 154 and extends toward a side opposite to the electronic component body 112.

While the first mount portion 146 and the second mount portion 156 extend toward the sides opposite to the electronic component body 112 in the present preferred embodiment, the first mount portion 146 and the second mount portion 156 may extend toward the electronic component body 112. However, the first mount portion 146 and the second mount portion 156 preferably extend toward the sides opposite to the electronic component body 112 because mounting by welding on the mounting substrate is able to be more easily performed.

Furthermore, a boundary portion at which the first extension portion 144 and the first mount portion 146 intersect with one another at a right angle or a substantial right angle, and a boundary portion at which the second extension portion 154 and the second mount portion 156 intersect with one another at a right angle or a substantial right angle may be rounded.

The first mount portion 146 preferably has a quadrangular or substantially quadrangular shape in plan view, for example. A center portion of the first mount portion 146 is bent in parallel or substantially in parallel to a direction orthogonal or substantially orthogonal to a direction in which the metal terminal extends, and thus a straight-line or substantially straight-line shaped first protruding bending portion 146a is provided to protrude toward the mounting surface of the mounting substrate. A recess on a side opposite to the mounting surface of the mounting substrate at the first protruding bending portion 146a defines and functions as a straight-line or substantially straight-line shaped first recessed bending portion 146b parallel or substantially parallel to the direction orthogonal or substantially orthogonal to the direction in which the metal terminal extends.

The second mount portion 156 preferably has a quadrangular or substantially quadrangular shape in plan view, for example. A center portion of the second mount portion 156 is bent in parallel or substantially in parallel to a direction orthogonal or substantially orthogonal to a direction in which the metal terminal extends, and thus a straight-line or substantially straight-line shaped second protruding bending portion 156a is provided to protrude toward the mounting surface of the mounting substrate. A recess on a side opposite to the mounting surface of the mounting substrate at the second protruding bending portion 156a define and functions as a straight-line or substantially straight-line shaped second recessed bending portion 156b parallel or substantially parallel to the direction orthogonal or substantially orthogonal to the direction in which the metal terminal extends.

Vertices of the first protruding bending portion 146a and the second protruding bending portion 156a protruding toward the mounting surface of the mounting substrate are in contact with the mounting surface of the mounting substrate.

Also, the first mount portion 146 of the first metal terminal 140a, and the second mount portion 156 of the second metal terminal 140b have small contact areas with respect to the mounting substrate. Welding is able to be performed by merely irradiating, with laser beams, the first recessed bending portion 146b on the side opposite to the mounting surface of the mounting substrate at the first protruding bending portion 146a, and the second recessed bending portion 156b on the side opposite to the mounting surface of the mounting substrate at the second protruding bending portion 156a. Thus, the welding time is decreased.

The first protruding bending portion 146a and the second protruding bending portion 156a may be angular or rounded. The first mount portion 146 of the first metal terminal 140a is formed by slightly pressing and deforming one end portion of the lead wire that defines the first metal terminal 140a. The second mount portion 156 of the second metal terminal 140b is formed by slightly pressing and deforming one end portion of the lead wire that defines the second metal terminal 140b.

In the ceramic electronic component 100 according to the present preferred embodiment, the height h of each of the first protruding bending portion 146a and the second protruding bending portion 156a is preferably in a range from about 0.1 mm to about 1 mm, for example, from a bottom surface of the first mount portion 146 or the second mount portion 156. Accordingly, laser energy is able to be reliably provided on portions at which the first mount portion 146 and the second mount portion 156 contact the board. Thus, the advantages according to preferred embodiments of the present invention are more effective.

Also, the width of each of the first protruding bending portion 146a and the second protruding bending portion 156a is preferably about 1.6 mm or smaller, for example. Accordingly, laser energy is able to be reliably provided on the portions at which the first mount portion 146 and the second mount portion 156 contact the board. Thus, the advantages according to preferred embodiments of the present invention are more effective.

Also, a surface of each of the first metal terminal 140a and the second metal terminal 140b preferably includes black color or an oxidized coating. Accordingly, absorption efficiency for the laser energy is increased, and laser welding is easily performed in a short period of time.

The first metal terminal 140a and the second metal terminal 140b each include a terminal body, and a plated film provided on a surface of the terminal body.

The terminal body is preferably made of, for example, a metal selected from Ni, iron (Fe), Cu, Ag, and chromium (Cr), or an alloy including as a main component at least one the metals. The terminal body is more preferably made of, for example, a metal selected from Ni, Fe, Cu, and Cr, or an alloy including as a main component at least one of the metals. Specifically, for example, the metal of the base material of the terminal body may be a Fe-42Ni alloy, a Fe-18Cr alloy, or a Cu-8Sn alloy. The diameter of each of the first metal terminal (lead wire) 140a and the second metal terminal (lead wire) 140b is preferably in a range from about 0.4 mm to about 0.8 mm, for example. If the diameter of each of the first metal terminal 140a and the second metal terminal 140b exceeds about 0.8 mm, conformity to through-hole board mounting or mounting by welding may be degraded. If the diameter is smaller than about 0.4 mm, the lead wire may be broken during processing of a product, mounting, or actual loading.

The plated film preferably includes a lower-layer plated film and an upper-layer plated film.

The lower-layer plated film is provided on the surface of the terminal body, and the upper-layer plated film is provided on the surface of the lower-layer plated film. Each of the lower-layer plated film and the upper-layer plated film may include a plurality of plated layers.

The plated film may not be provided on at least a peripheral surface 149 of the first extension portion 144 and the first mount portion 146 of the first metal terminal 140a, and a peripheral surface 151 of the second extension portion 154 and the second mount portion 156 of the second metal terminal 140b. Thus, when the ceramic electronic component 100 is mounted on the mounting substrate using solder, the solder does not spread upward on the first metal terminal 140a and the second metal terminal 140b. Since the solder does not spread upward in the area (lifted portion) between the electronic component body 112 and each of the first and second metal terminals 140a and 140b, the lifted portion is prevented from being filled with the solder. Accordingly, the space of the lifted portion is sufficiently ensured. Since the first extension portion 144 of the first metal terminal 140a, and the second extension portion 154 of the second metal terminal 140b are easily elastically deformed, the elastic deformation is able to absorb a mechanical strain that is generated in the ceramic plate when an alternating voltage is applied. The plated film may not be provided on the entire or substantially the entire peripheral surfaces of the first metal terminal 140a and the second metal terminal 140b.

To remove the plated film on the first extension portion 144 and the first mount portion 146 of the first metal terminal 140a, and the second extension portion 154 and the second mount portion 156 of the second metal terminal 140b, or the entire or substantially the entire peripheral surfaces of the first metal terminal 140a and the second metal terminal 140b, a method of removing the plated film by using a machine (cutting, grinding); a method of removing the plated film by using laser trimming; a method of removing the plated film by using a plating parting agent (for example, sodium hydroxide); or a method of covering portions, on which plating is not applied, with resist films before the plated films of the first metal terminal 140a and the second metal terminal 140b are formed, forming the plated films on the first metal terminal 140a and the second metal terminal 140b, and then removing the resist films after the plated films are formed on the first metal terminal 140a and the second metal terminal 140b may be used.

The lower-layer plated film is preferably made of, for example, a metal selected from Ni, Fe, Cu, Ag, and Cr, or an alloy including as a main component at least one of the metals. More preferably, the lower-layer plated film is preferably made of, for example, a metal selected from Ni, Fe, and Cr, or an alloy including as a main component at least one of the metals. The lower-layer plated film is made of a metal selected from Ni, Fe, and Cr whose melting points are high, or an alloy including as a main component at least one of the metals. Thus, heat resistance of the outer electrodes 130 is increased. The thickness of the lower-layer plated film is preferably in a range from about 0.2 μm to about 5.0 μm, for example.

The upper-layer plated film is preferably made of, for example, a metal selected from Sn, Ag, and Au, or an alloy including as a main component at least one of the metals. More preferably, the upper-layer plated film is made of, for example, Sn, or an alloy including Sn as a main component. Since the upper-layer plated film is made of Sn or an alloy including Sn as a main component, solderability between the first and second metal terminals 140a and 140b and the outer electrodes 130 is increased. The thickness of the upper-layer plated film is preferably in a range from about 1.0 μm to about 5.0 μm, for example.

Each of the terminal body and the lower-layer plated film is preferably made of a metal selected from Ni, Fe, and Cr whose melting points are high, or an alloy including as a main component at least one of the metals. Thus, heat resistance of the outer electrodes 130 is increased.

The outer resin material 170 covers the element body 114, the first outer electrode 130a, the second outer electrode 130b, a portion of the first metal terminal 140a, a portion of the second metal terminal 140b, the first joint material 160a between the first outer electrode 130a and the first metal terminal 140a, and the second joint material 160b between the second outer electrode 130b and the second metal terminal 140b.

The outer resin material 170 includes a first main surface 170a and a second main surface 170b that respectively face the first main surface 114a and the second main surface 114b of the element body 114.

The first main surface 170a and the second main surface 170b of the outer resin material 170 preferably have planar or substantially planar shapes.

The outer resin material 170 is formed, for example, by applying liquid or powder silicone-based or epoxy-based resin. The outer resin material 170 may be molded by a method of injection molding engineering plastics or a method of transfer molding engineering plastics. In particular, the outer resin material 170 is preferably made of thermosetting epoxy resin, for example. Thus, adhesion between the outer resin material 170 and the element body 114, or between the outer resin material 170 and the first and second metal terminals 140a and 140b is secured, and the advantageous effects of increasing voltage resistance and moisture resistance are obtained.

A protruding portion 172 that protrudes toward the mounting surface is provided at a surface of the outer resin material 170 on the mounting surface side (the second main surface 170b side). The protruding portion 172, together with the first protruding bending portion 146a of the first metal terminal 140a and the second protruding bending portion 156a of the second metal terminal 140b, is disposed such that the vertices of the protruding portion and protruding bending portions contact the mounting surface of the mounting substrate. With this configuration according to the present preferred embodiment, line contact in short segments is provided at three positions on the mounting surface of the mounting substrate. Accordingly, even when the mounting substrate is warped, or even when the connection positions are not in one plane due to a step, the contact state at the three positions is securely provided, and mounting by welding is reliably performed.

Also, since the contact areas of the first mount portion 146 of the first metal terminal 140a and the second mount portion 156 of the second metal terminal 140b with respect to the mounting substrate are small, welding is performed merely by irradiating, with the laser beams, the first recessed bending portion 146b on the side opposite to the mounting surface of the mounting substrate at the first protruding bending portion 146a, and the second recessed bending portion 156b on the side opposite to the mounting surface of the mounting substrate at the second protruding bending portion 156a. Thus, the welding time is also decreased.

The height of the protruding portion 172 is particularly limited, and is adjusted such that the vertex of the protruding portion 172, together with the vertices of the first protruding bending portion 146a of the first metal terminal 140a and the second protruding bending portion 156a of the second metal terminal 140b, contacts the mounting surface of the mounting substrate.

The position at which the protruding portion 172 is provided is determined so that the first protruding bending portion 146a, the second protruding bending portion 156a, and the protruding portion 172 are not located in one straight line. The protruding portion 172 is provided at the surface of the outer resin material 170 on the mounting surface side (the second main surface 170b side) on the side opposite to the side on which the first protruding bending portion 146a of the first metal terminal 140a and the second protruding bending portion 156a of the second metal terminal 140b are provided, with respect to a direction orthogonal or substantially orthogonal to a direction in which the metal terminals extend. In particular, the protruding portion 172 is preferably located at an end portion of the surface of the outer resin material 170 on the mounting surface side (the second main surface 170b side). Accordingly, the first protruding bending portion 146a, the second protruding bending portion 156a, and the protruding portion 172 contact the mounting surface of the mounting substrate more stably at three support points.

The first joint material 160a is used to join the first outer electrode 130a and the first terminal joint portion 142 of the first metal terminal 140a. The first joint material 160a is provided between the first terminal joint portion 142 of the first metal terminal 140a and the first outer electrode 130a (the first outer electrode 130a on the first main surface 114a) that faces the first terminal joint portion 142.

The second joint material 160b is used to join the second outer electrode 130b and the second terminal joint portion 152 of the second metal terminal 140b. The second joint material 160b is provided between the second terminal joint portion 152 of the second metal terminal 140b and the second outer electrode 130b (the second outer electrode 130b on the second main surface 114b) that faces the second terminal joint portion 152.

For the first joint material 160a and the second joint material 160b, solder or a conductive adhesive may be used.

When the solder is used, for example, it is preferable to use lead-free (LF) solder, such as tin-antimony-based (Sn—Sb-based), Sn—Ag—Cu-based, Sn—Cu-based, or Sn—Bi-based LF solder, for example. In the case of Sn—Sb-based solder, the percentage of content of Sb is preferably in a range from about 5% to about 15%, for example.

When the conductive adhesive is used, for example, a bonding agent in which a metal filler made of Ag or other suitable metal filler is added to thermosetting resin, such as epoxy resin is preferably used.

A dimension L is a dimension of the ceramic electronic component 100 in a direction in which the metal terminals extend, a dimension T is a dimension of the ceramic electronic component 100 in a direction in which the first main surface 170a and the second main surface 170b are coupled to one another, and a dimension W is a dimension of the ceramic electronic component 100 in a direction orthogonal to the direction in which the metal terminals extend.

Regarding the dimensions of the ceramic electronic component 100, preferably, the dimension L in the direction in which the metal terminals extend is in a range from about 4 mm to about 10 mm, the dimension W in the direction orthogonal to the direction in which the metal terminals extend is in a range from about 5 mm to about 12 mm, and the dimension T in the direction in which the first main surface 170a and the second main surface 170b are coupled to one another is in a range from about 2 mm to about 4 mm, for example.

Next, a mount structure for the ceramic electronic component 100 according to the present preferred embodiment of the present invention is described.

As illustrated in FIG. 7, the ceramic electronic component 100 is mounted on a mounting substrate 180. Specifically, the ceramic electronic component 100 is disposed on a mounting surface of the mounting substrate 180, and is joined to the mounting substrate 180 by welding at the first protruding bending portion 146a of the first mount portion 146 of the first metal terminal 140*a*, and the second protruding bending portion 156*a* of the second mount portion 156 of the second metal terminal 140*b*.

The joining by welding is preferably joining by welding using laser beams L. That is, mounting by welding is performed by irradiating, with the laser beams L, the first recessed bending portion 146*b* on the side opposite to the mounting surface of the mounting substrate 180 at the position of the first protruding bending portion 146*a*, and the second recessed bending portion 156*b* on the side opposite to the mounting surface of the mounting substrate 180 at the position of the second protruding bending portion 156*a*.

With the ceramic electronic component 100 according to the present preferred embodiment, since the first protruding bending portion 146*a* of the first mount portion 146, and the second protruding bending portion 156*a* of the second mount portion 156 are formed by bending, the first protruding bending portion 146*a*, the second protruding bending portion 156*a*, and the protruding portion 172 are able to contact the mounting surface of the mounting substrate 180 at three positions by line contact in short segments. Accordingly, even when the mounting substrate 180 is warped, or even when the connection positions are not in one plane due to a step, the contact on the mounting substrate 180 at the three positions is securely provided, and mounting by laser welding is reliably performed.

The first protruding bending portion 146*a* of the first mount portion 146 of the first metal terminal 140*a*, and the second protruding bending portion 156*a* of the second mount portion 156 of the second metal terminal 140*b* contact the mounting substrate 180 by line contact in short segments. The contact area is small, and mounting by welding is able to be performed by irradiating, with the laser beams L, the portions with the small areas of the first recessed bending portion 146*b* and the second recessed bending portion 156*b* having straight-line or substantially straight-line shapes. Thus, mounting by welding is easily performed in a short period of time.

First Modification of First Preferred Embodiment

Figure 8A:
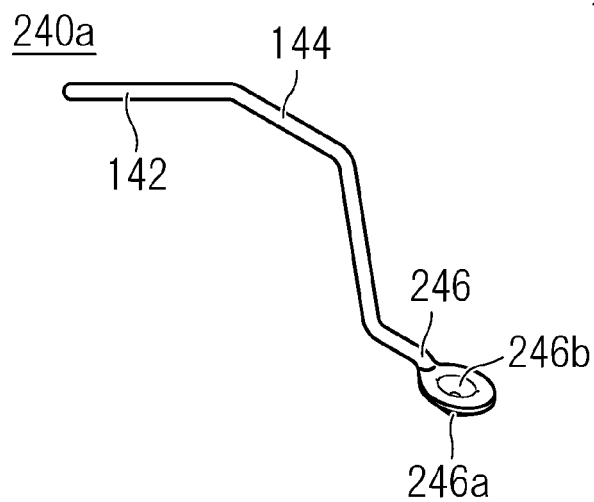
FIGS. 8A and 8B are external perspective views illustrating a first modification of metal terminals of the ceramic electronic component according to the first preferred embodiment of the present invention, FIG. 8A illustrating a first metal terminal, FIG. 8B illustrating a second metal terminal.
Figure 8B:
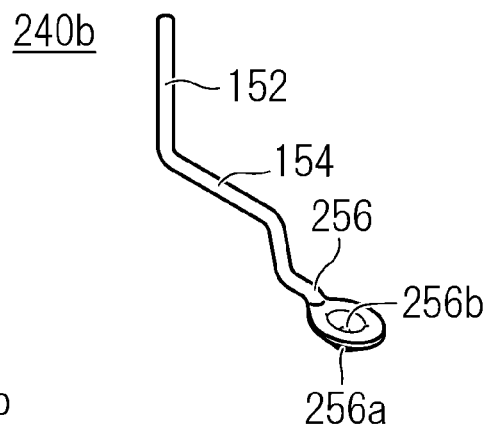

A first modification of metal terminals of the ceramic electronic component according to the first preferred embodiment of the present invention is described. FIGS. 8A and 8B are external perspective views illustrating the first modification of the metal terminals of the ceramic electronic component according to the first preferred embodiment of the present invention, FIG. 8A illustrating a first metal terminal, FIG. 8B illustrating a second metal terminal.

A first metal terminal 240*a* and a second metal terminal 240*b* of the ceramic electronic component according to the first modification of the first preferred embodiment have configurations similar to those of the metal terminals of the ceramic electronic component 100 described with reference to FIGS. 6A and 6B, except that a first mount portion 246 of the first metal terminal 240*a* and a second mount portion 256 of the second metal terminal 240*b* according to the first modification have different structures from those of the first mount portion 146 of the first metal terminal 140*a* and the second mount portion 156 of the second metal terminal 140*b* according to the first preferred embodiment. Thus, the same reference numbers are applied to portions that are the same or substantially the same as those of the first metal terminal 140*a* and the second metal terminal 140*b* of the ceramic electronic component 100 illustrated in FIGS. 6A and 6B, and the description thereof is omitted.

As illustrated in FIGS. 8A and 8B, regarding the first metal terminal 240*a* and the second metal terminal 240*b* according to the first modification of the first preferred embodiment, the first mount portion 246 of the first metal terminal 240*a* and the second mount portion 256 of the second metal terminal 240*b* preferably have circular or substantially circular shapes.

That is, the first mount portion 246 of the first metal terminal 240*a* is sufficiently pressed and deformed in a circular or substantially circular shape, and a semispherical or substantially semispherical first protruding bending portion 246*a* that protrudes toward the mounting surface of the mounting substrate is provided at a central portion of the first mount portion 246. A recess on the side opposite to the mounting surface of the mounting substrate at the first protruding bending portion 246*a* defines and functions as a semispherical or substantially semispherical first recessed bending portion 246*b*.

The second mount portion 256 of the second metal terminal 240*b* is sufficiently pressed and deformed in a circular or substantially circular shape, and a semispherical or substantially semispherical second protruding bending portion 256*a* that protrudes toward the mounting surface of the mounting substrate is provided at a central portion of the second mount portion 256. A recess on the side opposite to the mounting surface of the mounting substrate at the second protruding bending portion 256*a* defines and functions as a semispherical or substantially semispherical second recessed bending portion 256*b*.

Vertices of the first protruding bending portion 246*a* and the second protruding bending portion 256*a* that protrude toward the mounting surface of the mounting substrate are in contact with the mounting surface of the mounting substrate. At this time, the first protruding bending portion 246*a*, the second protruding bending portion 256*a*, and the protruding portion 172 are not located in one straight line. With such a configuration, point contact (or line contact in a short segment, or surface contact in a small area) is provided at each of three positions on the mounting surface of the mounting substrate. Accordingly, even when the mounting substrate is warped, or even when the connection positions are not in one plane due to a step, the contact on the mounting substrate at the three positions is securely provided, and mounting by welding is reliably performed.

Moreover, since the first mount portion 246 of the first metal terminal 240*a* and the second mount portion 256 of the second metal terminal 240*b* contact the mounting substrate by point contact, the contact area with respect to the mounting substrate is decreased as compared to the metal terminals illustrated in FIGS. 6A and 6B. Accordingly, the area by which the first recessed bending portion 246*b* on the side opposite to the mounting surface of the mounting substrate at the first protruding bending portion 246*a*, and the second recessed bending portion 256*b* on the side opposite to the mounting surface of the mounting substrate at the second protruding bending portion 256*a* are irradiated with laser beams is decreased, and the welding time is further decreased.

Second Modification of First Preferred Embodiment

Figure 9A:
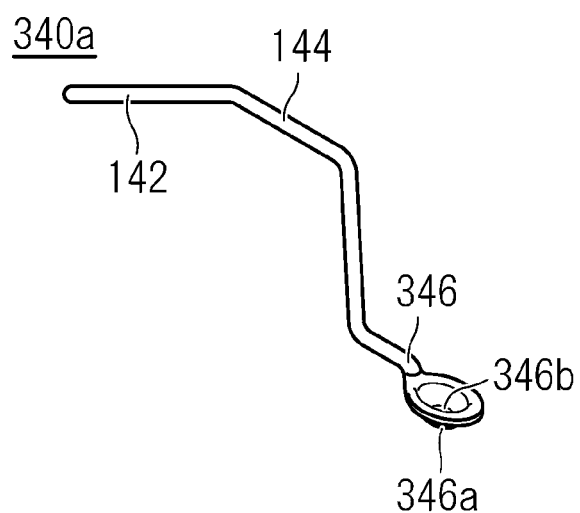
FIGS. 9A and 9B are external perspective views illustrating a second modification of metal terminals of the ceramic electronic component according to the first preferred embodiment of the present invention, FIG. 9A illustrating a first metal terminal, FIG. 9B illustrating a second metal terminal.
Figure 9B:
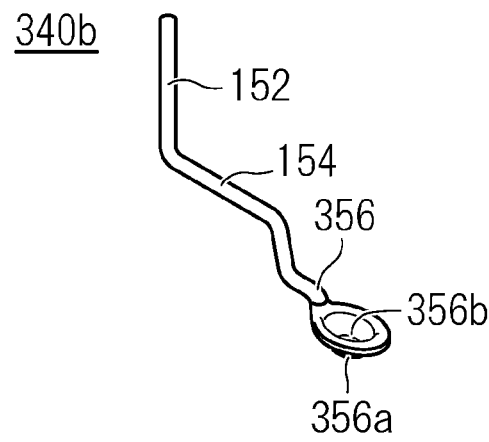

A second modification of metal terminals of the ceramic electronic component according to the first preferred embodiment of the present invention is described. FIGS. 9A and 9B are external perspective views illustrating the second modification of the metal terminals of the ceramic electronic component according to the first preferred embodiment of the present invention, FIG. 9A illustrating a first metal terminal, FIG. 9B illustrating a second metal terminal.

A first metal terminal 340a and a second metal terminal 340b of the ceramic electronic component according to the second modification of the first preferred embodiment have configurations similar to those of the metal terminals of the ceramic electronic component 100 described with reference to FIGS. 6A and 6B, except that a first mount portion 346 of the first metal terminal 340a and a second mount portion 356 of the second metal terminal 340b according to the second modification have different structures from those of the first mount portion 146 of the first metal terminal 140a and the second mount portion 156 of the second metal terminal 140b according to the first preferred embodiment. Thus, the same reference numbers are applied to portions that are the same or substantially the same as those of the first metal terminal 140a and the second metal terminal 140b of the ceramic electronic component 100 illustrated in FIGS. 6A and 6B, and the description thereof is omitted.

As illustrated in FIGS. 9A and 9B, regarding the first metal terminal 340a and the second metal terminal 340b according to the second modification of the first preferred embodiment, the first mount portion 346 of the first metal terminal 340a and the second mount portion 356 of the second metal terminal 340b preferably have ellipsoidal or substantially ellipsoidal shapes.

That is, the first mount portion 346 of the first metal terminal 340a is sufficiently pressed and deformed in an ellipsoidal or substantially ellipsoidal shape, and an ellipsoidal or substantially ellipsoidal first protruding bending portion 346a that protrudes toward the mounting surface of the mounting substrate is provided at a central portion of the first mount portion 346. A recess on the side opposite to the mounting surface of the mounting substrate at the first protruding bending portion 346a defines and functions as an ellipsoidal or substantially ellipsoidal first recessed bending portion 346b.

The second mount portion 356 of the second metal terminal 340b is sufficiently pressed and deformed in an ellipsoidal or substantially ellipsoidal shape, and an ellipsoidal or substantially ellipsoidal second protruding bending portion 356a that protrudes toward the mounting surface of the mounting substrate is provided at a central portion of the second mount portion 356. A recess on the side opposite to the mounting surface of the mounting substrate at the second protruding bending portion 356a defines and functions as an ellipsoidal or substantially ellipsoidal second recessed bending portion 356b.

Vertices of the first protruding bending portion 346a and the second protruding bending portion 356a that protrude toward the mounting surface of the mounting substrate are in contact with the mounting surface of the mounting substrate. At this time, the first protruding bending portion 346a, the second protruding bending portion 356a, and the protruding portion 172 are not located in one straight line. With such a configuration, surface contact in a small area is provided at each of three positions on the mounting surface of the mounting substrate. Accordingly, even when the mounting substrate is warped, or even when the connection positions are not in one plane due to a step, the contact on the mounting substrate at the three positions is securely provided, and mounting by welding is reliably performed.

Moreover, since the first mount portion 346 of the first metal terminal 340a and the second mount portion 356 of the second metal terminal 340b contact the mounting substrate by surface contact, the contact area with respect to the mounting substrate is slightly increased as compared to the metal terminals illustrated in FIGS. 6A and 6B. Accordingly, the joint strength of the first protruding bending portion 346a and the second protruding bending portion 356a with respect to the mounting surface of the mounting substrate is increased, and thus, the ceramic electronic component 100 including the first metal terminal 340a and the second metal terminal 340b is less likely to detach or fall from the mounting substrate.

Next, a preferred embodiment of a method of manufacturing the ceramic electronic component according to the first preferred embodiment having the above-described configuration is described, referring to the ceramic electronic component 100 as an example.

First, a raw material for manufacturing an element body is prepared and weighted.

Rounded stones are added to the raw material, and the raw material is mixed, crushed, stirred, and thus prepared.

Then, the prepared raw material is dried by a spray dryer or other suitable dryer.

Then, an additive, a binder, or other ingredient, is added to the raw material, thus a two-component raw material is prepared, the raw material is finely grounded, and then calcined.

The calcined raw material is shaped into a sheet shape or substantial sheet shape by using an extruding machine or other suitable machine.

Then, the molded sheet having the sheet shape or substantial sheet shape is punched into a disk shape or substantial disk tablet shape using a press forming machine or other suitable machine. The punched sheet having the disk shape or substantial disk shape is placed in a firing furnace, firing is performed, and thus, the disk-shaped or substantially disk-shaped element body 114 is manufactured. The firing temperature is preferably in a range from about 1100° C. to about 1400° C., for example, depending on the dielectric material.

Then, baked layers of the outer electrodes 130 are formed on both main surfaces of the element body 114. To form the first outer electrode 130a, outer-electrode conductive paste is applied to the first main surface 114a of the element body 114 and baked. Similarly, to form the second outer electrode 130b, outer-electrode conductive paste is applied to the second main surface 114b of the element body 114 and baked. Thus, the baked layers are formed. As necessary, at least one plated layer is formed on a surface of each of the baked layers, the outer electrodes 130 are formed, and the electronic component body 112 is manufactured.

Alternatively, for the outer electrodes 130, instead of forming the baked layers, a portion of a surface of the element body 114 on the first main surface 114a side may be plated and thus an underlying plated film may be formed. Similarly, a portion of the surface of the element body 114 on the second main surface 114b side may be plated and thus an underlying plated film may be formed. In this manner, the plated electrodes are directly formed on the first main surface 114a and the second main surface 114b of the element body 114.

The plating may be either of electrolytic plating and non-electrolytic plating. Non-electrolytic plating requires pre-processing with a catalyst to increase the plating precipitation speed, and the process may be complicated. Thus, electrolytic plating is preferably used. For the plating method, barrel plating is preferably used.

The first metal terminal 140a and the second metal terminal 140b are prepared. The first metal terminal 140a and the second metal terminal 140b are shaped by bending.

First, the second joint material 160b is applied to an upper surface of the second terminal joint portion 152 of the second metal terminal 140b (the surface facing the second main surface 114b of the element body 114). In this case, solder is used for the second joint material 160b.

Then, the electronic component body 112 is inserted into the area between the first metal terminal 140a and the second metal terminal 140b.

Then, the first joint material 160a is applied to a contact surface between the first metal terminal 140a and the first outer electrode 130a. In this case, solder is used for the first joint material 160a.

Then, reflow soldering is performed, and the first metal terminal 140a and the second metal terminal 140b are attached to the electronic component body 112.

Then, the outer resin material 170 is formed. The outer resin material 170 is formed, for example, by applying liquid or powder silicone-based or epoxy-based resin by dip coating to the electronic component body 112 to which the metal terminals are attached, and hardening the resin. The hardening temperature is preferably in a range from about 150° C. to about 200° C., for example, depending on the material of epoxy resin. The outer resin material 170 may be molded by a method of injection molding engineering plastics or a method of transfer molding engineering plastics. In particular, the outer resin material 170 is preferably made of thermosetting epoxy resin.

Then, after the outer resin material 170 is formed, the metal terminals protruding from the outer resin material 170 are bent along the side surface and bottom surface of the outer resin material 170, and the ceramic electronic component 100 illustrated in FIG. 1 is obtained.

Second Preferred Embodiment

Figure 10:
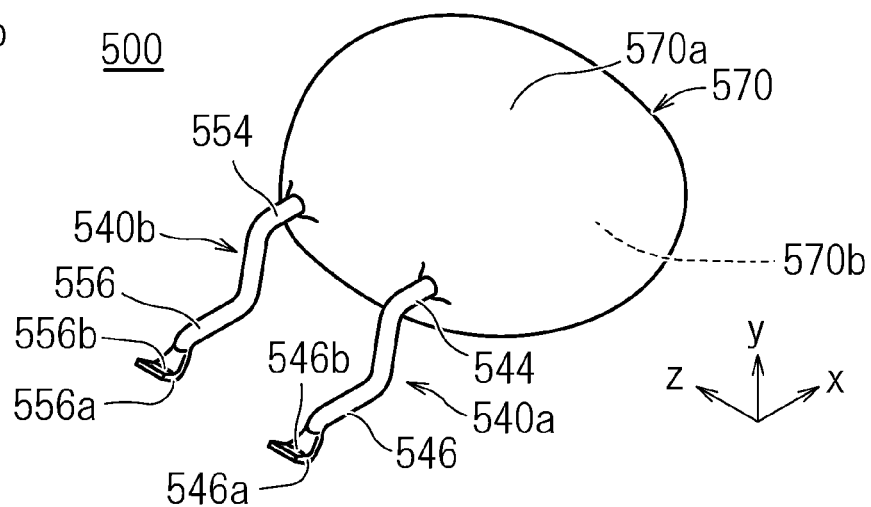
FIG. 10 is an external perspective view illustrating an example of a ceramic electronic component according to a second preferred embodiment of the present invention.
Figure 11:
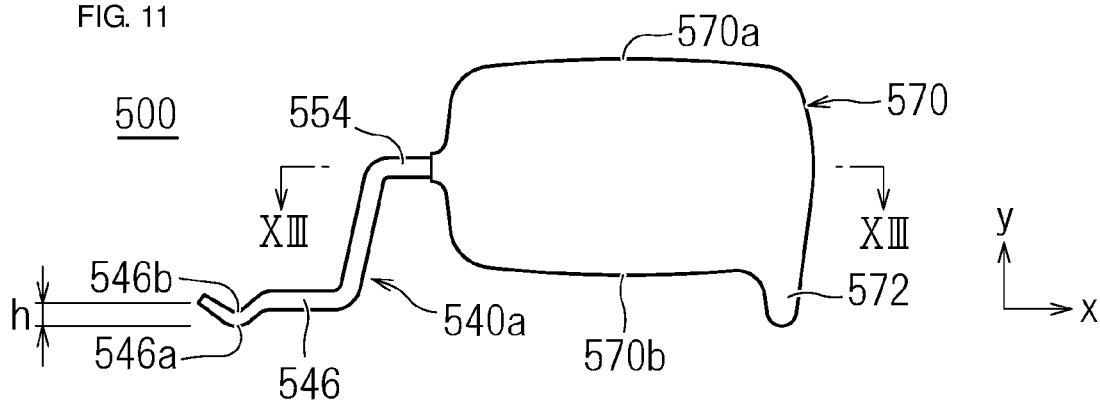
FIG. 11 is a side view illustrating the example of the ceramic electronic component according to the second preferred embodiment of the present invention.
Figure 12:
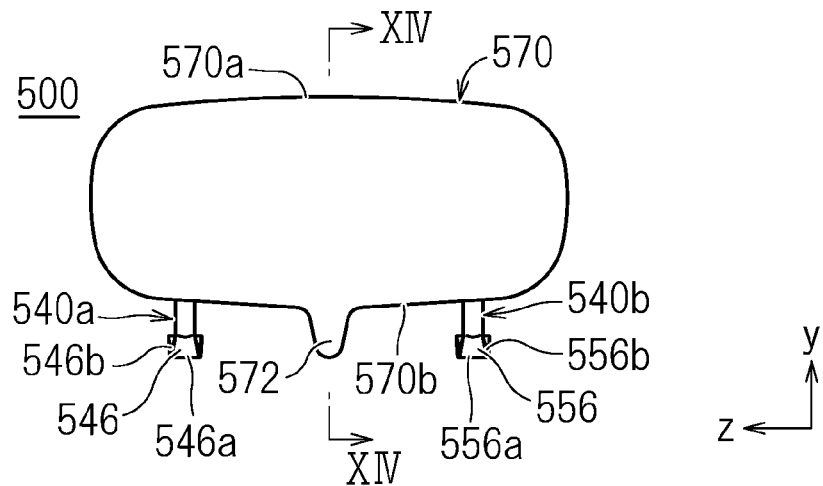
FIG. 12 is a front view illustrating the example of the ceramic electronic component according to the second preferred embodiment of the present invention.
Figure 13:
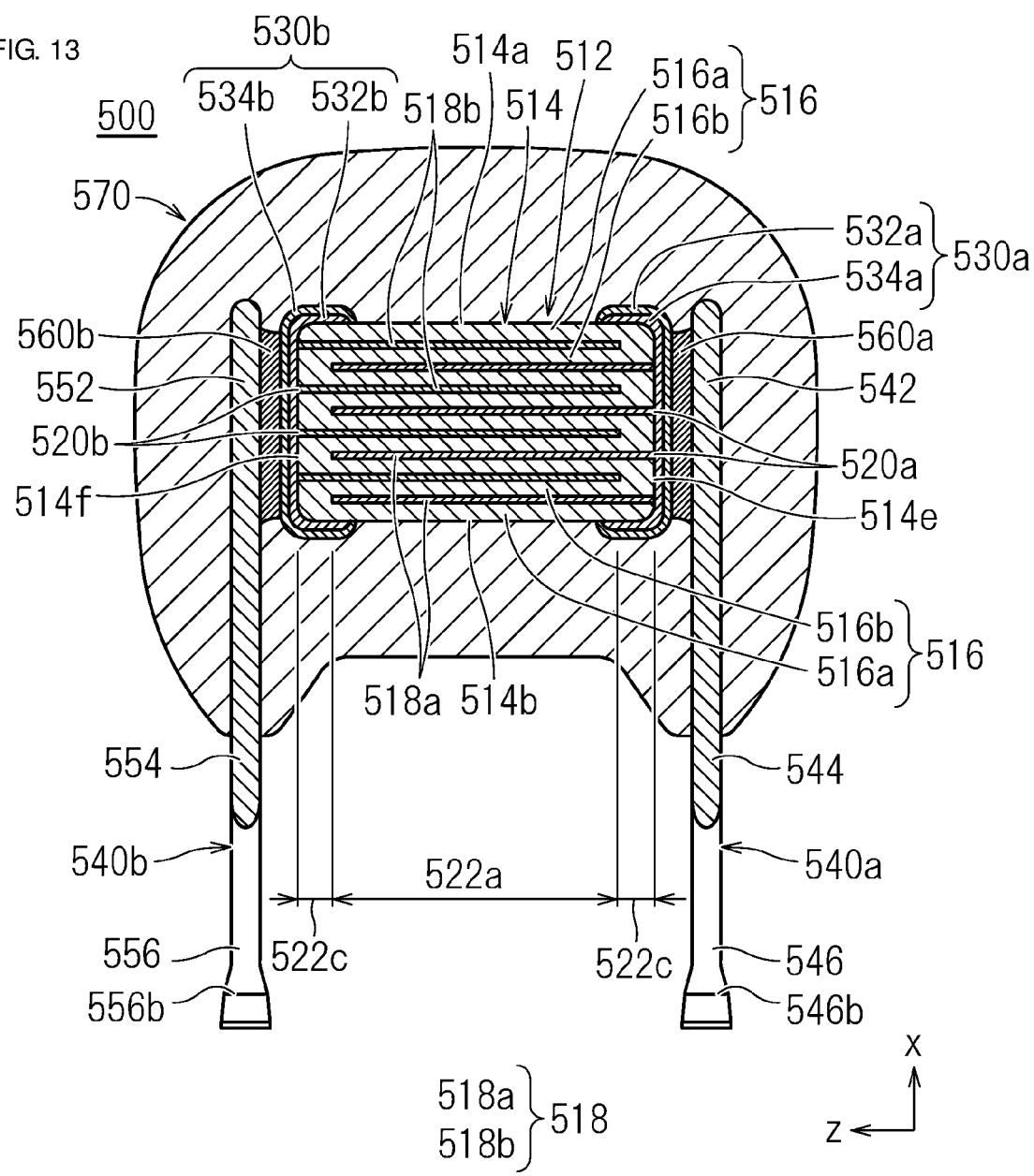
FIG. 13 is a sectional view taken along line XIII-XIII of FIG. 11, illustrating the ceramic electronic component according to the second preferred embodiment of the present invention.
Figure 14:
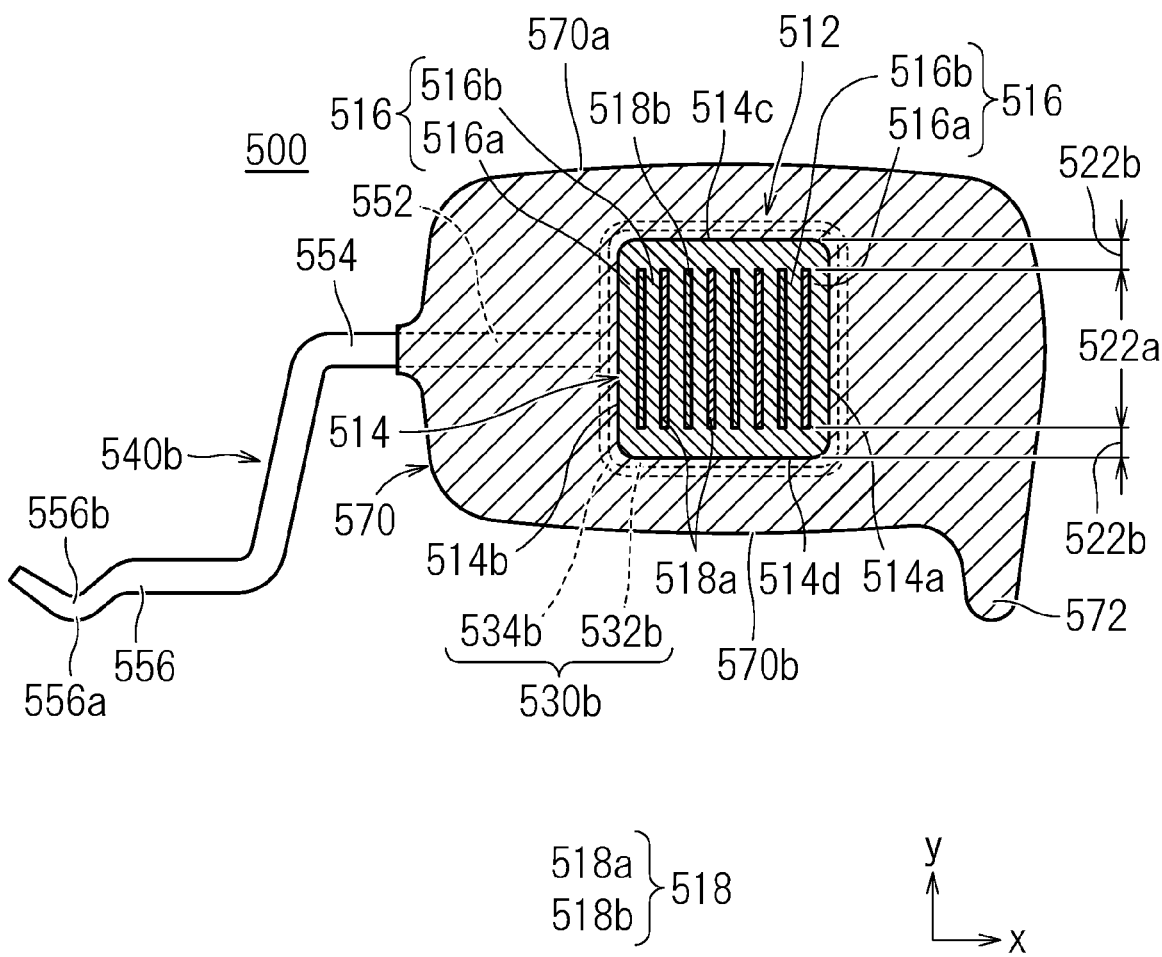
FIG. 14 is a sectional view taken along line XIV-XIV of FIG. 12, illustrating the ceramic electronic component according to the second preferred embodiment of the present invention.
Figure 15A:
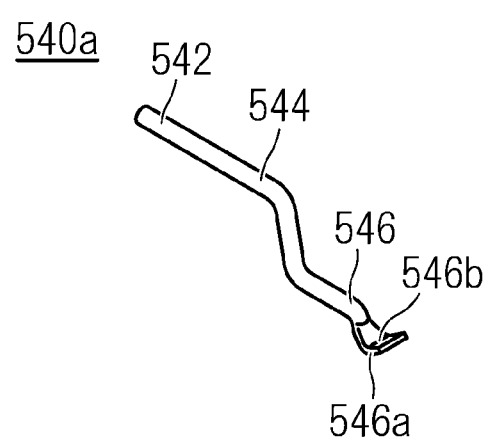
FIGS. 15A and 15B are external perspective views illustrating metal terminals included in the ceramic electronic component according to the second preferred embodiment of the present invention, FIG. 15A illustrating a first metal terminal, FIG. 15B illustrating a second metal terminal.
Figure 15B:
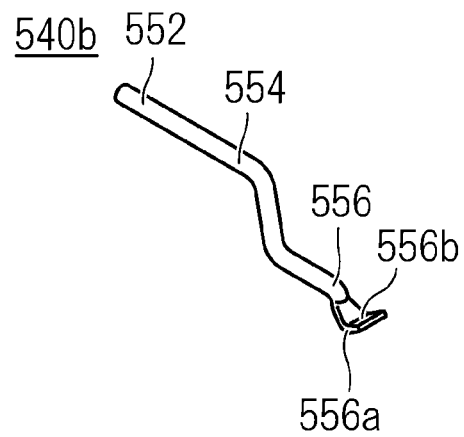
Figure 16:
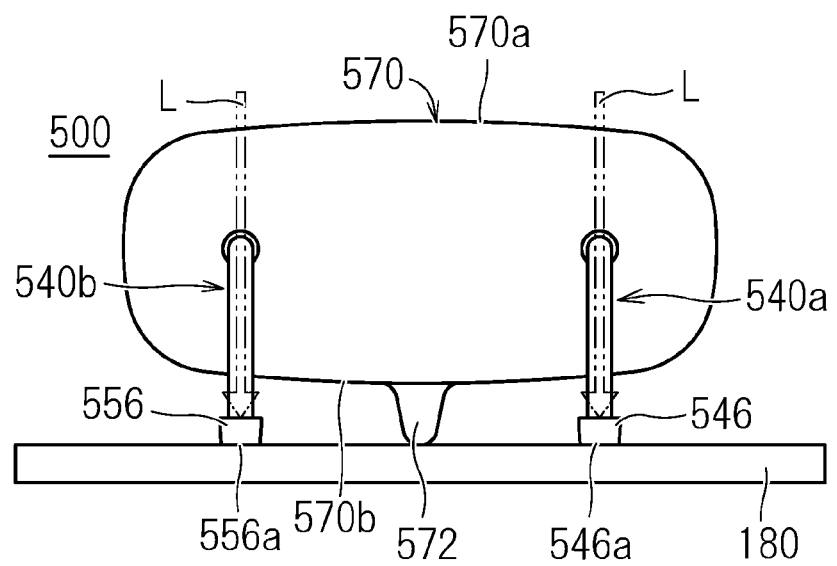
FIG. 16 is a schematic configuration diagram illustrating a state of a mount structure for the ceramic electronic component according to the second preferred embodiment of the present invention.

A ceramic electronic component according to a second preferred embodiment of the present invention is described. FIG. 10 is an external perspective view illustrating an example of a ceramic electronic component according to the second preferred embodiment of the present invention. FIG. 11 is a side view illustrating the example of the ceramic electronic component according to the second preferred embodiment of the present invention. FIG. 12 is a front view illustrating the example of the ceramic electronic component according to the second preferred embodiment of the present invention. FIG. 13 is a sectional view taken along line XIII-XIII of FIG. 11, illustrating the ceramic electronic component according to the second preferred embodiment of the present invention. FIG. 14 is a sectional view taken along line XIV-XIV of FIG. 12, illustrating the ceramic electronic component according to the second preferred embodiment of the present invention. FIGS. 15A and 15B are external perspective views illustrating metal terminals included in the ceramic electronic component according to the second preferred embodiment of the present invention, FIG. 15A illustrating a first metal terminal, FIG. 15B illustrating a second metal terminal. FIG. 16 is a schematic configuration diagram illustrating a state of a mount structure for the ceramic electronic component according to the second preferred embodiment of the present invention.

A ceramic electronic component 500 according to the second preferred embodiment of the present invention includes, for example, an electronic component body 512, and two metal terminals including a first metal terminal 540a and a second metal terminal 540b. The electronic component body 512 is connected to the first metal terminal 540a via a first joint material 560a. The electronic component body 512 is connected to the second metal terminal 540b via a second joint material 560b. Also, the ceramic electronic component 500 includes an outer resin material 570 that covers the electronic component body 512, at least a portion of the first metal terminal 540a, and at least a portion of the second metal terminal 540b.

The electronic component body 512 includes a rectangular or substantially rectangular-parallelepiped element body 514.

The element body 514 includes, in a stacked manner, a plurality of ceramic layers 516, and a plurality of inner electrode layers 518. Further, the element body 514 includes a first main surface 514a and a second main surface 514b that are opposed to one another in a stack direction x, a first side surface 514c and a second side surface 514d that are opposed to one another in a width direction y orthogonal or substantially orthogonal to the stack direction x, and a first end surface 514e and a second end surface 514f that are opposed to one another in a length direction z orthogonal or substantially orthogonal to the stack direction x and the width direction y. Corner portions and ridge portions of the element body 514 are preferably rounded. The corner portions are each a portion at which three adjacent surfaces of the element body intersect with one another. The ridge portions are each a portion at which two adjacent surfaces of the element body intersect with one another.

Protrusions and recesses may be provided at a portion or the entirety of each of the first main surface 514a and the second main surface 514b, the first side surface 514c and the second side surface 514d, and the first end surface 514e and the second end surface 514f.

The ceramic layers 516 include an outer-layer portion 516a including a plurality of ceramic layers 516, and an inner-layer portion 516b including a single ceramic layer 516 or a plurality of ceramic layers 516. The outer-layer portion 516a is located on the sides near the first main surface 514a and the second main surface 514b of the element body 514. The outer-layer portion 516a is a ceramic layer 516 located between the first main surface 514a and the inner electrode layer 518 that is the closest to the first main surface 514a, and is a ceramic layer 516 located between the second main surface 514b and the inner electrode layer 518 that is the closest to the second main surface 514b. The region sandwiched by both the outer-layer portions 516a is the inner-layer portion 516b.

The ceramic layers 516 may be made of a dielectric material. The dielectric material may preferably be dielectric ceramics including, for example, $BaTiO_3$, $CaTiO_3$, $SrTiO_3$, or $CaZrO_3$, as a main component. When the dielectric material is included as a main component, a component having less content than that of a Mn compound, a Fe compound, a Cr compound, a Co compound, or a Ni compound may be added in accordance with the desired characteristics of the electronic component body 512.

When piezoelectric ceramics are used for the element body 514, the electronic component body defines and functions as a ceramic piezoelectric element. A specific example of the material of piezoelectric ceramics may be, for example, a PZT-based ceramic material.

When semiconductor ceramics is used for the element body 514, the electronic component body defines and functions as a thermistor element. A specific example of the semiconductor ceramic material may be, for example, a spinel-based ceramic material.

When magnetic ceramics is used for the element body 514, the electronic component body defines and functions as an inductor element. Also, when the element body 514 functions as an inductor element, the inner electrode layer 518 is a coil-shaped or substantially coil-shaped conductor. A specific example of the magnetic ceramic material may be, for example, a ferrite ceramic material.

The thickness of each ceramic layer 516 after firing is preferably in a range from about 0.5 μm to about 80 μm, for example.

As illustrated in FIGS. 13 and 14, the element body 514 includes, as the plurality of inner electrode layers 518, a plurality of quadrangular or substantially quadrangular first inner electrode layers 518a and a plurality of quadrangular or substantially quadrangular second inner electrode layers 518b. The plurality of first inner electrode layers 518a and the plurality of second inner electrode layers 518b are embedded and alternately arranged at regular intervals in the stack direction x of the element body 514.

The first inner electrode layers 518a each include a first extended electrode portion 520a extended to the first end surface 514e of the element body 514, on one end side of the first inner electrode layer 518a. The second inner electrode layers 518b each include a second extended electrode portion 520b extended to the second end surface 514f of the element body 514, on one end side of the second inner electrode layer 518b. Specifically, the first extended electrode portion 520a on the one end side of the first inner electrode layer 518a is exposed from the first end surface 514e of the element body 514. Also, the second extended electrode portion 520b on the one end side of the second inner electrode layer 518b is exposed from the second end surface 514f of the element body 514.

The inner electrode layers 518 may be disposed in parallel or substantially in parallel to the mounting surface, or perpendicular or substantially perpendicular to the mounting surface.

The element body 514 includes, in the inner-layer portion 516b of the ceramic layer 516, a counter electrode portion 522a in which the first inner electrode layer 518a and the second inner electrode layer 518b face one another. Also, the element body 514 includes side portions (hereinafter, referred to as "W gaps") 522b provided between one end in the width direction y of the counter electrode portion 522a and the first side surface 514c, and between the other end in the width direction y of the counter electrode portion 522a and the second side surface 514d. Further, the element body 514 includes end portions (hereinafter, referred to as "L gaps") 522c provided between an end portion of the first inner electrode layer 518a on the side opposite to the first extended electrode portion 520a and the second end surface 514f, and between an end portion of the second inner electrode layer 518b on the side opposite to the second extended electrode portion 520b and the first end surface 514e.

The inner electrode layers 518 each preferably include, for example, a metal selected from Ni, Cu, Ag, Pd, and Au, or an alloy, such as an Ag—Pd alloy including at least one of the metals. The inner electrode layer 518 may further include dielectric particles having the same or substantially the same composition of ceramics included in the ceramic layer 516.

The thickness of the inner electrode layer 518 is preferably in a range from about 0.2 μm to about 2.0 μm, for example.

Outer electrodes 530 are provided on the first end surface 514e side and the second end surface 514f side of the element body 514. The outer electrodes 530 include a first outer electrode 530a and a second outer electrode 530b.

The first outer electrode 530a is provided on the first end surface 514e of the element body 514, and extends from the first end surface 514e to cover a portion of the first main surface 514a, a portion of the second main surface 514b, a portion of the first side surface 514c, and a portion of the second side surface 514d. In this case, the first outer electrode 530a is electrically connected to the first extended electrode portion 520a of the first inner electrode layer 518a. Alternatively, the first outer electrode 530a may be provided on only the first end surface 514e of the element body 514.

The second outer electrode 530b is provided on the second end surface 514f of the element body 514, and extends from the second end surface 514f to cover a portion of the first main surface 514a, a portion of the second main surface 514b, a portion of the first side surface 514c, and a portion of the second side surface 514d. In this case, the second outer electrode 530b is electrically connected to the second extended electrode portion 520b of the second inner electrode layer 518b. Alternatively, the second outer electrode 530b may be provided on only the second end surface 514f of the element body 514.

In the element body 514, since the first inner electrode layer 518a faces the second inner electrode layer 518b via the ceramic layer 516 in the counter electrode portion 522a, an electrostatic capacitance is provided. Thus, an electrostatic capacitance is provided between the first outer electrode 530a to which the first inner electrode layer 518a is connected and the second outer electrode 530b to which the second inner electrode layer 518b is connected. The electronic component body having such a structure defines and functions as a capacitor element.

As illustrated in FIGS. 13 and 14, the first outer electrode 530a includes, in the order from the element body 514 side, a first underlying electrode layer 532a, and a first plated layer 534a provided on a surface of the first underlying electrode layer 532a. Similarly, the second outer electrode 530b includes, in the order from the element body 514 side, a second underlying electrode layer 532b, and a second plated layer 534b provided on a surface of the second underlying electrode layer 532b.

The first underlying electrode layer 532a is provided on the surface of the first end surface 514e of the element body 514, and extends from the first end surface 514e to cover a portion of the first main surface 514a, a portion of the second main surface 514b, a portion of the first side surface 514c, and a portion of the second side surface 514d. Alternatively, the first underlying electrode layer 532a may be provided on only the first end surface 514e of the element body 514.

The second underlying electrode layer 532b is provided on the surface of the second end surface 514f of the element body 514, and extends from the second end surface 514f to cover a portion of the first main surface 514a, a portion of the second main surface 514b, a portion of the first side surface 514c, and a portion of the second side surface 514d. Alternatively, the second underlying electrode layer 532b may be provided on only the second end surface 514f of the element body 514.

The first underlying electrode layer 532a and the second underlying electrode layer 532b each preferably include at least one selected from a baked layer, a thin-film layer, and other layers, for example. The material and structure of the first underlying electrode layer 532a and the second underlying electrode layer 532b are the same or substantially the same as those of the first underlying electrode layer 132a and the second underlying electrode layer 132b, and thus, the description thereof is omitted.

The first plated layer 534a covers the first underlying electrode layer 532a. Specifically, the first plated layer 534a is preferably provided on the first end surface 514e on the surface of the first underlying electrode layer 532a, and preferably extends to the first main surface 514a and the second main surface 514b, and the first side surface 514c and the second side surface 514d on the surface of the first underlying electrode layer 532a. If the first underlying electrode layer 532a is provided on only the first end surface 514e of the element body 514, the first plated layer 534a may cover only the surface of the first underlying electrode layer 532a.

Similarly, the second plated layer 534b covers the second underlying electrode layer 532b. Specifically, the second plated layer 534b is preferably provided on the second end surface 514f on the surface of the second underlying electrode layer 532b, and preferably extends to the first main surface 514a and the second main surface 514b, and the first side surface 514c and the second side surface 514d on the surface of the second underlying electrode layer 532b. If the second underlying electrode layer 532b is provided on only the second end surface 514f of the element body 514, the second plated layer 534b may cover only the surface of the second underlying electrode layer 532b.

The material and structure of the first plated layer 534a and the second plated layer 534b are the same or substantially the same as those of the first plated layer 134a and the second plated layer 134b, and thus, the description thereof is omitted.

Next, a case in which the first underlying electrode layer 532a and the second underlying electrode layer 532b are made of plated electrodes is described. The first underlying electrode layer 532a is made of a plated layer that is directly connected to the first inner electrode layer 518a, is directly provided on the surface of the first end surface 514e of the element body 514, and extends from the first end surface 514e to cover a portion of the first main surface 514a, a portion of the second main surface 514b, a portion of the first side surface 514c, and a portion of the second side surface 514d.

The second underlying electrode layer 532b is made of a plated layer that is directly connected to the second inner electrode layer 518b, is directly provided on the surface of the second end surface 514f of the element body 514, and extends from the second end surface 514f to cover a portion of the first main surface 514a, a portion of the second main surface 514b, a portion of the first side surface 514c, and a portion of the second side surface 514d.

To enable the first underlying electrode layer 532a and the second underlying electrode layer 532b to be made of plated layers, a catalyst is provided on the element body 514 for pre-processing.

The first underlying electrode layer 532a made of the plated layer is preferably covered with the first plated layer 534a. Similarly, the second underlying electrode layer 532b made of the plated layer is preferably covered with the second plated layer 534b.

In this case, the material and structure of the first underlying electrode layer 532a and the second underlying electrode layer 532b, and the material and structure of the first plated layer 534a and the second plated layer 534b are preferably the same or substantially the same as those of the first underlying electrode layer 132a and the second underlying electrode layer 132b, and those of the first plated layer 134a and the second plated layer 134b. Thus, the description thereof is omitted.

The first plated layer 534a and the second plated layer 534b are provided as necessary. The first outer electrode 530a may include only the first underlying electrode layer 532a, and the second outer electrode 530b may include only the second underlying electrode layer 532b. Alternatively, the first plated layer 534a and the second plated layer 534b may be provided as the outermost layers of the first outer electrode 530a and the second outer electrode 530b, or another plated layer may be provided on the first plated layer 534a or the second plated layer 534b.

Metal terminals include the first metal terminal 540a and the second metal terminal 540b.

The first metal terminal 540a and the second metal terminal 540b are provided to mount the ceramic electronic component 500 on the mounting substrate.

The first metal terminal 540a is connected to the first outer electrode 530a of the electronic component body 512 via the first joint material 560a.

The second metal terminal 540b is connected to the second outer electrode 530b of the electronic component body 512 via the second joint material 560b.

The first metal terminal 540a is preferably defined by, for example, a lead wire having a circular or substantially circular cross section, for example. The first metal terminal 540a includes a first terminal joint portion 542 that extends in the stack direction x in which the first main surface 514a and the second main surface 514b are coupled to one another and that is connected to the first outer electrode 530a, a first extension portion 544 that is connected to the first terminal joint portion 542 and that extends in a direction toward the mounting surface to define a gap between the ceramic electronic component 500 and the mounting surface of the mounting substrate, and a first mount portion 546 that is connected to the first extension portion 544 and that extends to a side opposite to the electronic component body 512.

The second metal terminal 540b is preferably defined by, for example, a lead wire having a circular or substantially circular cross section, for example. The second metal terminal 540b includes a second terminal joint portion 552 that extends in the stack direction x in which the first main surface 514a and the second main surface 514b are coupled to one another and that is connected to the second outer electrode 530b; a second extension portion 554 that is connected to the second terminal joint portion 552 and that extends in the direction toward the mounting surface to define a gap between the ceramic electronic component 500 and the mounting surface of the mounting substrate; and a second mount portion 556 that is connected to the second extension portion 554 and that extends to a side opposite to the electronic component body 512.

The first terminal joint portion 542 of the first metal terminal 540a is connected to the first outer electrode 530a provided on the first end surface 514e of the electronic component body 512 to extend in the stack direction x in which the first main surface 514a and the second main surface 514b are coupled to one another, for example, via the first joint material 560a. The length of the first terminal joint portion 542 is not particularly limited. The first terminal joint portion 542 may be provided entirely or substantially entirely in the height direction of the first end surface 514e, or may be accommodated in the stack direction x.

The second terminal joint portion 552 of the second metal terminal 540b is connected to the second outer electrode 530b provided on the second end surface 514f of the electronic component body 512 to extend in the stack direction x in which the first main surface 514a and the second main surface 514b are coupled to one another, for example, via the second joint material 560b. The length of the second terminal joint portion 552 is not particularly limited. The second terminal joint portion 552 may be provided entirely or substantially entirely in the height direction of the second end surface 514f, or may be accommodated in the stack direction x.

The first extension portion 544 of the first metal terminal 540a extends from the first terminal joint portion 542, bends at an intermediate portion thereof in the direction toward the mounting surface to define a gap between the electronic component body 512 and the mounting surface of the mounting substrate, and extends. The second extension portion 554 of the second metal terminal 540b extends from the second terminal joint portion 552, bends at an intermediate portion thereof in the direction toward the mounting surface to define a gap between the electronic component body 512 and the mounting surface of the mounting substrate, and extends.

The first extension portion 544 of the first metal terminal 540a and the second extension portion 554 of the second metal terminal 540b lift the electronic component body 512 to be spaced away from the mounting substrate on which the multilayer ceramic electronic component 500 is mounted. Accordingly, elastic deformation of the first extension portion 544 and the second extension portion 554 is able to absorb, for example, a stress that is generated due to a difference in thermal expansion coefficient between the mounting substrate and the ceramic electronic component 500, a stress that is generated when the mounting substrate bends, and a mechanical strain that is generated in the ceramic layer 516 when a voltage is applied.

The first mount portion 546 of the first metal terminal 540a is connected to the first extension portion 544 and extends toward a side opposite to the electronic component body 512. The second mount portion 556 of the second metal terminal 540b is connected to the second extension portion 554 and extends toward a side opposite to the electronic component body 512.

While the first mount portion 546 and the second mount portion 556 extend toward the sides opposite to the electronic component body 512 in the present preferred embodiment, the first mount portion 546 and the second mount portion 556 may extend toward the electronic component body 512. However, the first mount portion 546 and the second mount portion 556 preferably extend toward the sides opposite to the electronic component body 512 because mounting by welding on the mounting substrate is able to be easily performed.

Furthermore, a boundary portion at which the first extension portion 544 and the first mount portion 546 intersect with one another at a right angle or a substantially right angle, and a boundary portion at which the second extension portion 554 and the second mount portion 556 intersect with one another at a right angle or a substantially right angle may be rounded.

The first mount portion 546 preferably has a quadrangular or substantially quadrangular shape in plan view, for example. A central portion of the first mount portion 546 is bent in parallel or substantially in parallel to the length direction z in which the first end surface 514e and the second end surface 514f are coupled to one another, and thus, a straight-line or substantially straight-line shaped first protruding bending portion 546a protrudes toward the mounting surface of the mounting substrate. A recess on a side opposite to the mounting surface of the mounting substrate at the first protruding bending portion 546a defines and functions as a straight-line or substantially straight-line shaped first recessed bending portion 546b parallel or substantially parallel to the length direction z in which the first end surface 514e and the second end surface 514f are coupled to one another.

The second mount portion 556 preferably has a quadrangular or substantially quadrangular shape in plan view, for example. A central portion of the second mount portion 556 is bent in parallel or substantially in parallel to the length direction z in which the first end surface 514e and the second end surface 514f are coupled to one another, and thus, a straight-line or substantially straight-line shaped second protruding bending portion 556a protrudes toward the mounting surface of the mounting substrate. A recess on a side opposite to the mounting surface of the mounting substrate at the second protruding bending portion 556a defines and functions as a straight-line or substantially straight-line shaped second recessed bending portion 556b parallel or substantially parallel to the length direction z in which the first end surface 514e and the second end surface 514f are coupled to one another.

Vertices of the first protruding bending portion 546a and the second protruding bending portion 556a protruding toward the mounting surface of the mounting substrate are in contact with the mounting surface of the mounting substrate.

Also, the first mount portion 546 of the first metal terminal 540a, and the second mount portion 556 of the second metal terminal 540b have small contact areas with respect to the mounting substrate. Welding is able to be performed by merely irradiating, with laser beams, the first recessed bending portion 546b on the side opposite to the mounting surface of the mounting substrate at the first protruding bending portion 546a, and the second recessed bending portion 556b on the side opposite to the mounting surface of the mounting substrate at the second protruding bending portion 556a. Thus, the welding time is decreased.

The first protruding bending portion 546a and the second protruding bending portion 556a may be angular or rounded. The first mount portion 546 of the first metal terminal 540a is formed by slightly pressing and deforming one end portion of the lead wire that defines the first metal terminal 540a. The second mount portion 556 of the second metal terminal 540b is formed by slightly pressing and deforming one end portion of the lead wire that defines the second metal terminal 540b.

In the ceramic electronic component 500 according to the present preferred embodiment, the height h of each of the first protruding bending portion 546a and the second protruding bending portion 556a is preferably in a range from about 0.1 mm to about 1 mm, for example, from a bottom surface of the first mount portion 546 or the second mount portion 556. Accordingly, laser energy is able to be reliably provided on portions at which the first mount portion 546 and the second mount portion 556 contact the board. Thus, the advantages according to the present preferred embodiment of the present invention are more effective.

Also, a surface of each of the first metal terminal 540a and the second metal terminal 540b includes a black color or an oxidized coating. Accordingly, absorption efficiency for the laser energy is increased, and laser welding is easily performed in a short period of time.

The first metal terminal 540a and the second metal terminal 540b each include a terminal body, and a plated film provided on a surface of the terminal body. The materials and structures of the terminal body and the plated film of each of the first metal terminal 540a and the second metal terminal 540b are the same or substantially the same as those of the first metal terminal 140a and the second metal terminal 140b, and thus, the description thereof is omitted.

The plated film may not be provided on at least a peripheral surface 549 of the first extension portion 544 and the first mount portion 546 of the first metal terminal 540a, and a peripheral surface 551 of the second extension portion 554 and the second mount portion 556 of the second metal terminal 540b.

The outer resin material 570 covers the element body 514, the first outer electrode 530a, the second outer electrode 530b, a portion of the first metal terminal 540a, a portion of the second metal terminal 540b, the first joint material 560a between the first outer electrode 530a and the first metal terminal 540a, and the second joint material 560b between the second outer electrode 530b and the second metal terminal 540b.

The outer resin material 570 includes a first main surface 570a and a second main surface 570b that respectively face the first side surface 514c and the second side surface 514d of the element body 514.

The first main surface 570a and the second main surface 570b of the outer resin material 570 may preferably have planar or substantially planar shapes.

The material of the outer resin material 570 is the same as that of the outer resin material 170, and thus, the description thereof is omitted.

A protruding portion 572 that protrudes toward the mounting surface is provided at a surface of the outer resin material 570 on the mounting surface side (the second main surface 570b side). The protruding portion 572, together with the first protruding bending portion 546a of the first metal terminal 540a and the second protruding bending portion 556a of the second metal terminal 540b, is disposed such that the vertices of the protruding portion and protruding bending portions contact the mounting surface of the mounting substrate. With this configuration according to the present preferred embodiment, line contact by short segments is provided at three positions on the mounting surface of the mounting substrate. Accordingly, even when the mounting substrate is warped, or even when the connection positions are not in one plane due to a step, the contact state at the three positions is securely provided, and mounting by welding is reliably performed.

Also, since the contact areas of the first mount portion 546 of the first metal terminal 540a and the second mount portion 556 of the second metal terminal 540b with respect to the mounting substrate are small, welding is able to be performed merely by irradiating, with the laser beams, the first recessed bending portion 546b on the side opposite to the mounting surface of the mounting substrate at the first protruding bending portion 546a, and the second recessed bending portion 556b on the side opposite to the mounting surface of the mounting substrate at the second protruding bending portion 556a. Thus, the welding time is also decreased.

The height of the protruding portion 572 is not particularly limited, and is adjusted such that the vertex of the protruding portion 572, together with the vertices of the first protruding bending portion 546a of the first metal terminal 540a and the second protruding bending portion 556a of the second metal terminal 540b, contacts the mounting surface of the mounting substrate.

The position at which the protruding portion 572 is provided is determined so that the first protruding bending portion 546a, the second protruding bending portion 556a, and the protruding portion 572 are not disposed in one straight line. The protruding portion 572 is provided at the surface of the outer resin material 570 on the mounting surface side (the second main surface 570b side) on the side opposite to the side on which the first protruding bending portion 546a of the first metal terminal 540a and the second protruding bending portion 556a of the second metal terminal 540b are provided. In particular, the protruding portion 572 is preferably located at an end portion of the surface of the outer resin material 570 on the mounting surface side (the second main surface 570b side). Accordingly, the first protruding bending portion 546a, the second protruding bending portion 556a, and the protruding portion 572 contact the mounting surface of the mounting substrate more stably at three support points.

The first joint material 560a is used to join the first outer electrode 530a and the first terminal joint portion 542 of the first metal terminal 540a. The first joint material 560a is provided between the first terminal joint portion 542 of the first metal terminal 540a and the first outer electrode 530a (the first outer electrode 530a on the first end surface 514e) that faces the first terminal joint portion 542. The first joint material 560a extends on a central portion of the first outer electrode 530a in the stack direction x in which the first main surface 514a and the second main surface 514b are coupled to one another.

The second joint material 560b is used to join the second outer electrode 530b and the second terminal joint portion 552 of the second metal terminal 540b. The second joint material 560b is provided between the second terminal joint portion 552 of the second metal terminal 540b and the second outer electrode 530b (the second outer electrode 530b on the second end surface 514f) that faces the second terminal joint portion 552. The second joint material 560b extends on a central portion of the second outer electrode 530b in the stack direction x in which the first main surface 514a and the second main surface 514b are coupled to one another.

The material of the first joint material 560a and the second joint material 560b is the same as or similar to that of the first joint material 160a and the second joint material 160b, and the description thereof is omitted.

A dimension L is a dimension of the ceramic electronic component 500 in a direction in which the metal terminals extend, a dimension T is a dimension of the ceramic electronic component 500 in a direction in which the first main surface 570a and the second main surface 570b are coupled to one another, and a dimension W is a dimension of the ceramic electronic component 500 in a direction orthogonal or substantially orthogonal to the direction in which the metal terminals extend.

Regarding the dimensions of the ceramic electronic component 500, preferably, the dimension L in the direction in which the metal terminals extend is in a range from about 1.2 mm to about 12 mm, the dimension W in the direction orthogonal to the direction in which the metal terminals extend is in a range from about 2 mm to about 20 mm, and the dimension T in the direction in which the first main surface 570a and the second main surface 570b are coupled to one another is in a range from about 1.2 mm to about 5 mm, for example.

Next, a mount structure for the ceramic electronic component 500 according to the present preferred embodiment of the present invention is described.

As illustrated in FIG. 16, the ceramic electronic component 500 is mounted on a mounting substrate 180. Specifically, the ceramic electronic component 500 is disposed on a mounting surface of the mounting substrate 180, and is joined to the mounting substrate 180 by welding at the first protruding bending portion 546a of the first mount portion 546 of the first metal terminal 540a, and the second protruding bending portion 556a of the second mount portion 556 of the second metal terminal 540b.

The joining by welding is preferably joining by welding using laser beams L. That is, mounting by welding is performed by irradiating, with the laser beams L, the first recessed bending portion 546b on the side opposite to the mounting surface of the mounting substrate 180 at the position of the first protruding bending portion 546a, and the second recessed bending portion 556b on the side opposite to the mounting surface of the mounting substrate 180 at the position of the second protruding bending portion 556a.

With the ceramic electronic component 500 according to the present preferred embodiment, since the first protruding bending portion 546a of the first mount portion 546, the second protruding bending portion 556a of the second mount portion 556, and the protruding portion 572 of the outer resin material 570 are provided, the portions contact the mounting surface of the mounting substrate 180 at three positions by line contact in short segments. Accordingly, even when the mounting substrate 180 is warped, or even when the connection positions are not in one plane due to a step, the contact with the mounting substrate 180 at the three positions is securely provided, and mounting by laser welding is reliably performed.

With the mount structure for the ceramic electronic component 500 according to the present preferred embodiment, the vertices of the first protruding bending portion 546a of the first metal terminal 540a, the second protruding bending portion 556a of the second metal terminal 540b, and the protruding portion 572 of the outer resin material 570 are in contact with the corresponding mounting surfaces of the mounting substrate 180. The contact area is small, and mounting by welding is performed by irradiating, with the laser beams L, the portions with the small areas of the first recessed bending portion 546b and the second recessed bending portion 556b. Thus, mounting by welding is able to be easily performed in a short period of time.

First Modification of Second Preferred Embodiment

Figure 17A:
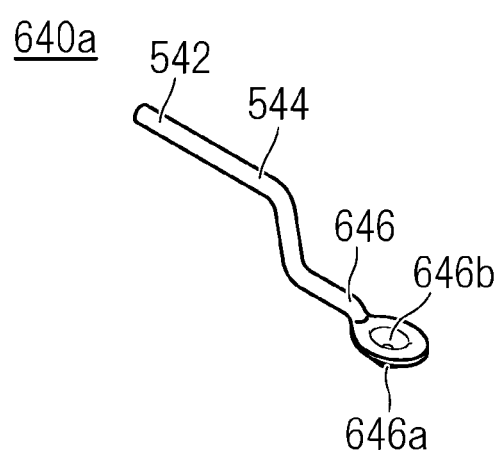
FIGS. 17A and 17B are external perspective views illustrating a first modification of metal terminals of the ceramic electronic component according to the second preferred embodiment of the present invention, FIG. 17A illustrating a first metal terminal, FIG. 17B illustrating a second metal terminal.
Figure 17B:
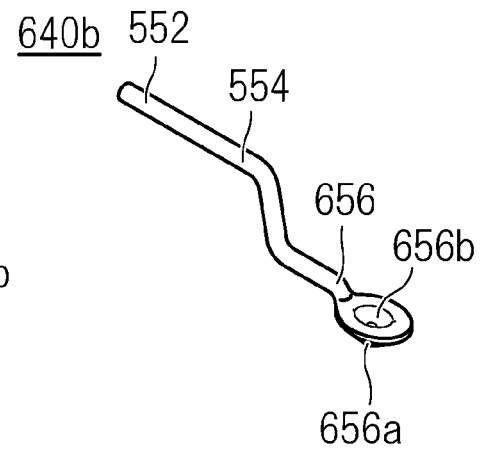

A first modification of metal terminals of the ceramic electronic component according to the second preferred embodiment of the present invention is described. FIGS. 17A and 17B are external perspective views illustrating the first modification of the metal terminals of the ceramic electronic component according to the second preferred embodiment of the present invention, FIG. 17A illustrating a first metal terminal, FIG. 17B illustrating a second metal terminal.

A first metal terminal 640a and a second metal terminal 640b of the ceramic electronic component according to the first modification of the second preferred embodiment have configurations similar to those of the metal terminals of the ceramic electronic component 500 described with reference to FIGS. 15A and 15B, except that a first mount portion 646 of the first metal terminal 640a and a second mount portion 656 of the second metal terminal 640b according to the first modification have structures different from those of the first mount portion 546 of the first metal terminal 540a and the second mount portion 556 of the second metal terminal 540b according to the second preferred embodiment. Thus, the same reference signs are applied to portions that are the same or substantially the same as those of the first metal terminal 540a and the second metal terminal 540b of the ceramic electronic component 500 illustrated in FIGS. 15A and 15B, and the description thereof is omitted.

As illustrated in FIGS. 17A and 17B, regarding the first metal terminal 640a and the second metal terminal 640b according to the first modification of the second preferred embodiment, the first mount portion 646 of the first metal terminal 640a and the second mount portion 656 of the second metal terminal 640b have circular or substantially circular shapes.

That is, the first mount portion 646 of the first metal terminal 640a is sufficiently pressed and deformed in a circular or substantially circular shape, and a semispherical or substantially semispherical first protruding bending portion 646a that protrudes toward the mounting surface of the mounting substrate is provided at a central portion of the first mount portion 646. A recess on the side opposite to the mounting surface of the mounting substrate at the first protruding bending portion 646a defines and functions as a semispherical or substantially semispherical first recessed bending portion 646b.

The second mount portion 656 of the second metal terminal 640b is sufficiently pressed and deformed in a circular or substantially circular shape, and a semispherical or substantially semispherical second protruding bending portion 656a that protrudes toward the mounting surface of the mounting substrate is provided at a central portion of the second mount portion 656. A recess on the side opposite to the mounting surface of the mounting substrate at the second protruding bending portion 656a defines and functions as a semispherical or substantially semispherical second recessed bending portion 656b.

Vertices of the first protruding bending portion 646a and the second protruding bending portion 656a that protrude toward the mounting surface of the mounting substrate are in contact with the mounting surface of the mounting substrate. At this time, the first protruding bending portion 646a, the second protruding bending portion 656a, and the protruding portion 572 are not disposed in one straight line. With such a configuration, point contact (or line contact in a short segment, or surface contact in a small area) is provided at each of three positions on the mounting surface of the mounting substrate. Accordingly, even when the mounting substrate is warped, or even when the connection positions are not in one plane due to a step, the contact on the mounting substrate at the three positions is securely provided, and mounting by welding is reliably performed.

Moreover, since the first mount portion 646 of the first metal terminal 640a and the second mount portion 656 of the second metal terminal 640b contact the mounting substrate by point contact, the contact area with respect to the mounting substrate is decreased as compared to the metal terminals illustrated in FIGS. 15A and 15B. Accordingly, the area by which the first recessed bending portion 646b on the side opposite to the mounting surface of the mounting substrate at the first protruding bending portion 646a, and the second recessed bending portion 656b on the side opposite to the mounting surface of the mounting substrate at the second protruding bending portion 656a are irradiated with laser beams is decreased, and the welding time is further decreased.

Second Modification of Second Preferred Embodiment

A second modification of metal terminals of the ceramic electronic component according to the second preferred embodiment of the present invention is described. FIGS.

Figure 18A:
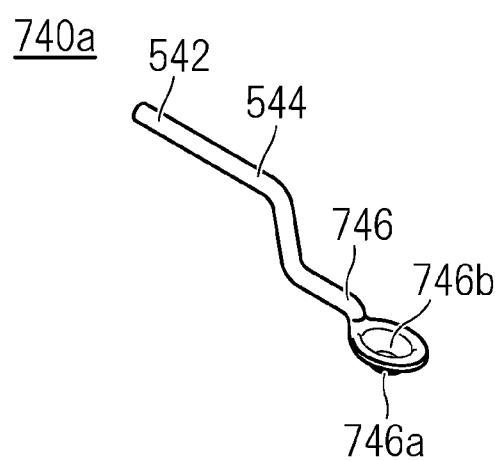
FIGS. 18A and 18B are external perspective views illustrating a second modification of metal terminals of the ceramic electronic component according to the second preferred embodiment of the present invention, FIG. 18A illustrating a first metal terminal, FIG. 18B illustrating a second metal terminal.
Figure 18B:
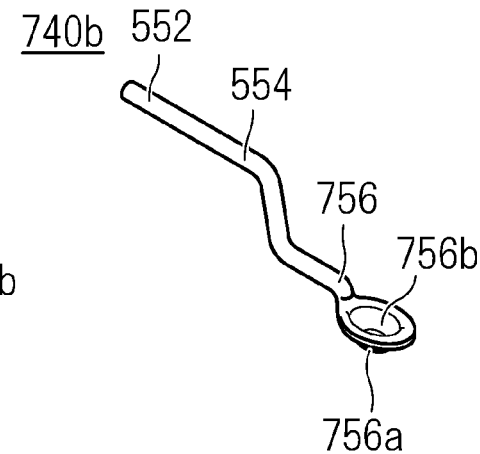

18A and 18B are external perspective views illustrating the second modification of the metal terminals of the ceramic electronic component according to the second preferred embodiment of the present invention, FIG. 18A illustrating a first metal terminal, FIG. 18B illustrating a second metal terminal.

A first metal terminal 740a and a second metal terminal 740b of the ceramic electronic component according to the second modification of the second preferred embodiment have configurations similar to those of the metal terminals of the ceramic electronic component 500 described with reference to FIGS. 15A and 15B, except that a first mount portion 746 of the first metal terminal 740a and a second mount portion 756 of the second metal terminal 740b according to the second modification have structures different from those of the first mount portion 546 of the first metal terminal 540a and the second mount portion 556 of the second metal terminal 540b according to the second preferred embodiment. Thus, the same reference numbers are applied to portions that are the same or substantially the same as those of the first metal terminal 540a and the second metal terminal 540b of the ceramic electronic component 500 illustrated in FIGS. 15A and 15B, and the description thereof is omitted.

As illustrated in FIGS. 18A and 18B, regarding the first metal terminal 740a and the second metal terminal 740b according to the second modification of the second preferred embodiment, the first mount portion 746 of the first metal terminal 740a and the second mount portion 756 of the second metal terminal 740b preferably have ellipsoidal or substantially ellipsoidal shapes.

That is, the first mount portion 746 of the first metal terminal 740a is sufficiently pressed and deformed in an ellipsoidal or substantially ellipsoidal shape, and an ellipsoidal or substantially ellipsoidal first protruding bending portion 746a that protrudes toward the mounting surface of the mounting substrate is provided at a central portion of the first mount portion 746. A recess on the side opposite to the mounting surface of the mounting substrate at the first protruding bending portion 746a defines and functions as an ellipsoidal or substantially ellipsoidal first recessed bending portion 746b.

The second mount portion 756 of the second metal terminal 740b is sufficiently pressed and deformed in an ellipsoidal or substantially ellipsoidal shape, and an ellipsoidal or substantially ellipsoidal second protruding bending portion 756a that protrudes toward the mounting surface of the mounting substrate is provided at a central portion of the second mount portion 756. A recess on the side opposite to the mounting surface of the mounting substrate at the second protruding bending portion 756a defines and functions as an ellipsoidal or substantially ellipsoidal second recessed bending portion 756b.

Vertices of the first protruding bending portion 746a and the second protruding bending portion 756a that protrude toward the mounting surface of the mounting substrate are in contact with the mounting surface of the mounting substrate. At this time, the first protruding bending portion 746a, the second protruding bending portion 756a, and the protruding portion 572 are not disposed in one straight line. With such a configuration, surface contact in a small area is provided at each of three positions on the mounting surface of the mounting substrate. Accordingly, even when the mounting substrate is warped, or even when the connection positions are not in one plane due to a step, the contact on the mounting substrate at the three positions is securely provided, and mounting by welding is reliably performed.

Moreover, since the first mount portion 746 of the first metal terminal 740a and the second mount portion 756 of the second metal terminal 740b contact the mounting substrate by surface contact, the contact areas of the metal terminals 740a and 740b with respect to the mounting substrate are slightly larger than the contact areas of the metal terminals illustrated in FIGS. 15A and 15B. Accordingly, the joint strength of the first protruding bending portion 746a and the second protruding bending portion 756a with respect to the mounting surface of the mounting substrate is increased, and thus, the ceramic electronic component 500 including the first metal terminal 740a and the second metal terminal 740b is less likely to detach or fall from the mounting substrate.

Next, a preferred embodiment of a method of manufacturing the ceramic electronic component according to the second preferred embodiment having the above-described configuration is described, referring to the ceramic electronic component 500 as an example.

First, a ceramic green sheet, inner-electrode conductive paste for forming the inner electrode layer 518, and an outer-electrode conductive paste for forming the outer electrode 530 are prepared. The ceramic green sheet, the inner-electrode conductive paste, and the outer-electrode conductive paste include an organic binder and a solvent. A known organic binder and a known organic solvent may be used.

For example, the inner-electrode conductive paste is applied in a predetermined pattern to the ceramic green sheet. Thus, an inner-electrode pattern is formed on the ceramic green sheet. The inner-electrode conductive paste may be applied by a known method, such as screen printing or gravure printing, for example.

Then, a predetermined number of outer-layer ceramic green sheets on which the inner-electrode pattern is not applied by printing are stacked, the ceramic green sheets on which the inner-electrode patterns are applied by printing are sequentially stacked thereon, a predetermined number of outer-layer ceramic green sheets are stacked thereon, and thus, an element body sheet is fabricated. Then, the element body sheet is pressure bonded in the stack direction x by isostatic press or another method, and thus, an element body block is fabricated.

Then, the element body block is cut into a predetermined shape and dimension, and a raw element body chip is cut out. At this time, corner portions and ridge portions of the raw element body may be rounded, for example, by barrel finishing. Then, the cut out, raw element body chip is fired, and thus, the element body 514 is produced. The firing temperature of the raw element body chip is preferably in a range from about 900° C. to about 1300° C., for example, depending on the material of the ceramics or the material of the inner-electrode conductive paste.

Next, to form the baked layer of the first outer electrode 530a, for example, the outer-electrode conductive paste is applied to exposed portions of the first extended electrode portions 520a of the first inner electrode layers 518a exposed from the first end surface 514e of the element body 514 and baked. Similarly, to form the baked layer of the second outer electrode 530b, for example, the outer-electrode conductive paste is applied to exposed portions of the second extended electrode portions 520b of the second inner electrode layers 518b exposed from the second end surface 514f of the element body 514 and baked. Thus, the baked layers are formed. At this time, the baking temperature is preferably in a range from about 700° C. to about 900° C., for example. As necessary, at least one plated layer is formed on a surface of each baked layer, the outer electrode 530 is formed, and the electronic component body 512 is manufactured.

Alternatively, for the outer electrode 530, instead of forming the baked layer, a portion of a surface of the element body 514 on the first end surface 514e side may be plated and thus an underlying plated film may be formed on the exposed portions of the first extended electrode portions 520a of the first inner electrode layers 518a exposed from the first end surface 514e. Similarly, a portion of a surface of the element body 514 on the second end surface 514f side is plated and thus an underlying plated film may be formed on the exposed portions of the second extended electrode portions 520b of the second inner electrode layers 518b exposed from the second end surface 514f.

The plating may be either of electrolytic plating and non-electrolytic plating. Non-electrolytic plating requires pre-processing with a catalyst to increase the plating precipitation speed, and the process may be complicated. Accordingly, electrolytic plating is preferably used. For the plating method, barrel plating is preferably used.

If a partial conductor of the outer electrode 530 is formed on the surfaces of the first main surface 514a and the second main surface 514b of the element body 514, a surface conductor pattern may be applied by printing on a ceramic green sheet of the outermost layer in advance, and may be fired simultaneously with the element body 514. Alternatively, a surface conductor may be applied by printing on the first main surface 514a and the second main surface 514b of the fired element body 514 and may be baked. Further, an upper plated layer is formed on a surface of the underlying plated layer as necessary.

In this manner, plated electrodes are directly formed on the first end surface 514e and the second end surface 514f of the element body 514.

A step of attaching the metal terminals in the method of manufacturing the ceramic electronic component according to the present preferred embodiment is described.

First, the first metal terminal 540a and the second metal terminal 540b are prepared.

The first metal terminal 540a and the second metal terminal 540b are shaped by bending.

Then, the first joint material (solder) 560a is applied to a surface of the first outer electrode 530a on the first end surface 514e of the electronic component body 512 or a surface of the first terminal joint portion 542 of the prepared first metal terminal 540a. Then, by performing reflowing in a state in which the first outer electrode 530a of the electronic component body 512 is joined to the first terminal joint portion 542 of the first metal terminal 540a, the first metal terminal 540a is attached to the first outer electrode 530a of the electronic component body 512. Similarly, the second joint material (solder) 560b is applied to a surface of the second outer electrode 530b on the second end surface 514f of the electronic component body 512 or a surface of the second terminal joint portion 552 of the prepared second metal terminal 540b. Then, by performing reflowing in a state in which the second outer electrode 530b of the electronic component body 512 is joined to the second terminal joint portion 552 of the second metal terminal 540b, the second metal terminal 540b is attached to the second outer electrode 530b of the electronic component body 512.

Then, the outer resin material 570 is formed. The outer resin material 570 is formed, for example, by applying liquid or powder silicone-based or epoxy-based resin by dip coating to the electronic component body 512 to which the metal terminals are attached, and hardening the resin. The hardening temperature is preferably in a range from about 150° C. to about 200° C., for example, depending on the material of epoxy resin. The outer resin material 570 may be molded by a method of injection molding engineering plastics or a method of transfer molding engineering plastics. In particular, the outer resin material 570 is preferably made of thermosetting epoxy resin.

Then, after the outer resin material 570 is formed, the metal terminals protruding from the outer resin material 570 are bent along the side surface and bottom surface of the outer resin material 570, and the ceramic electronic component 500 illustrated in FIG. 10 is obtained.

The present invention is not limited to the above-described preferred embodiments, and may be modified within the scope of the present invention. The thickness of each ceramic layer, the number of ceramic layers, the area of counter electrode, and the external dimension of the electronic component body are not limited to the exemplified values.

While the multilayer ceramic electronic component 500 according to the above-described preferred embodiment includes only one electronic component body 512, it is not limited thereto. Two or more electronic component bodies 512 may be stacked.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic electronic component comprising:
  an element body including a first main surface and a second main surface that are opposed to one another;
  an electronic component body including a first outer electrode provided on the element body, and a second outer electrode provided on the element body;
  a first metal terminal connected to the first outer electrode and defined by a lead wire;
  a second metal terminal connected to the second outer electrode and defined by a lead wire; and
  an outer resin material that covers the electronic component body, the first and second outer electrodes, a portion of the first metal terminal, and a portion of the second metal terminal; wherein
  the second main surface of the element body is located on a side near a mounting surface of a mounting substrate on which the ceramic electronic component is to be mounted;
  the first metal terminal includes:
    a first terminal joint portion that is connected to the first outer electrode;
    a first extension portion that is connected to the first terminal joint portion and that defines a gap between the electronic component body and the mounting surface of the mounting substrate; and
    a first mount portion that is connected to the first extension portion and that extends toward a side opposite to the electronic component body;
  the second metal terminal includes:
    a second terminal joint portion that is connected to the second outer electrode;
    a second extension portion that is connected to the second terminal joint portion and that defines a gap between the electronic component body and the mounting surface of the mounting substrate; and a second mount portion that is connected to the second extension portion and that extends toward a side opposite to the electronic component body;

the outer resin material includes a protruding portion that protrudes toward the mounting surface of the mounting substrate;

the first mount portion includes a first protruding bending portion that protrudes toward the mounting surface of the mounting substrate;

the second mount portion includes a second protruding bending portion that protrudes toward the mounting surface of the mounting substrate; and vertices of the first protruding bending portion, the second protruding bending portion, and the protruding portion are in contact with the mounting surface of the mounting substrate.

2. The ceramic electronic component according to claim 1, wherein a height of each of the first protruding bending portion and the second protruding bending portion is in a range from about 0.1 mm to about 1 mm.

3. The ceramic electronic component according to claim 1, wherein a surface of each of the first metal terminal and the second metal terminal includes a black color or an oxidized coating.

4. The ceramic electronic component according to claim 1, wherein each of the first and second protruding bending portion defines and functions as a straight-line or substantially straight-line shaped first recessed bending portion parallel or substantially parallel to a direction orthogonal or substantially orthogonal to a direction in which the respective first and second metal terminals extend.

5. The ceramic electronic component according to claim 1, wherein each of the first and second mount portions has a quadrangular or substantially quadrangular shape in plan view.

6. The ceramic electronic component according to claim 1, wherein each of the lead wires defining the first and second metal terminals has a circular or substantially circular cross section.

7. The ceramic electronic component according to claim 1, wherein the first protruding bending portion, the second protruding bending portions, and the protruding portion are not disposed in one straight line.

8. The ceramic electronic component according to claim 1, wherein
each of the first and second mount portions has a circular or substantially circular shape; and
each of the first and second protruding bending portions is defined by a semispherical or substantially semispherical protruding bending portion that protrudes toward the mounting surface of the mounting substrate at a central portion of the respective first and second mount portions.

9. The ceramic electronic component according to claim 1, wherein
each of the first and second mount portions has an elliptical or substantially elliptical shape; and
each of the first and second protruding bending portions is defined by an ellipsoidal or substantially ellipsoidal protruding bending portion that protrudes toward the mounting surface of the mounting substrate at a central portion of the respective first and second mount portions.

10. A mount structure for a ceramic electronic component, wherein
the ceramic electronic component includes:
an element body including a first main surface and a second main surface that are opposed to one another;
an electronic component body including a first outer electrode provided on the element body, and a second outer electrode provided on the element body;
a first metal terminal connected to the first outer electrode and defined by a lead wire;
a second metal terminal connected to the second outer electrode and defined by a lead wire; and
an outer resin material that covers the electronic component body, the first and second outer electrodes, a portion of the first metal terminal, and a portion of the second metal terminal;
the second main surface of the element body is located on a side near a mounting surface of a mounting substrate on which the ceramic electronic component is to be mounted;
the first metal terminal includes:
a first terminal joint portion that is connected to the first outer electrode;
a first extension portion that is connected to the first terminal joint portion and that defines a gap between the electronic component body and the mounting surface of the mounting substrate; and
a first mount portion that is connected to the first extension portion and that extends toward a side opposite to the electronic component body;
the second metal terminal includes:
a second terminal joint portion that is connected to the second outer electrode;
a second extension portion that is connected to the second terminal joint portion and that defines a gap between the electronic component body and the mounting surface of the mounting substrate; and
a second mount portion that is connected to the second extension portion and that extends toward a side opposite to the electronic component body;
the outer resin material includes a protruding portion that protrudes toward the mounting surface of the mounting substrate;
the first mount portion includes a first protruding bending portion that protrudes toward the mounting surface of the mounting substrate;
the second mount portion includes a second protruding bending portion that protrudes toward the mounting surface of the mounting substrate;
vertices of the first protruding bending portion and the second protruding bending portion are joined to the mounting surface of the mounting substrate;
the joining is performed by welding to the mounting surface of the mounting substrate from a first recessed bending portion on a side opposite to the mounting surface of the mounting substrate at a position of the first protruding bending portion; and
the joining is performed by welding to the mounting surface of the mounting substrate from a second recessed bending portion on a side opposite to the mounting surface of the mounting substrate at a position of the second protruding bending portion.

11. The mount structure for the ceramic electronic component according to claim 10, wherein the joining by welding is joining by laser welding that is performed by irradiating the first recessed bending portion and the second recessed bending portion with laser beams.

12. The mount structure for the ceramic electronic component according to claim 10, wherein a height of each of the first protruding bending portion and the second protruding bending portion is in a range from about 0.1 mm to about 1 mm.

13. The mount structure for the ceramic electronic component according to claim 10, wherein a surface of each of the first metal terminal and the second metal terminal includes a black color or an oxidized coating.

14. The mount structure for the ceramic electronic component according to claim 10, wherein each of the first and second protruding bending portion defines and functions as a straight-line or substantially straight-line shaped first recessed bending portion parallel or substantially parallel to a direction orthogonal or substantially orthogonal to a direction in which the respective first and second metal terminals extend.

15. The mount structure for the ceramic electronic component according to claim 10, wherein each of the first and second mount portions has a quadrangular or substantially quadrangular shape in plan view.

16. The mount structure for the ceramic electronic component according to claim 10, wherein each of the lead wires defining the first and second metal terminals has a circular or substantially circular cross section.

17. The mount structure for the ceramic electronic component according to claim 10, wherein the first protruding bending portion, the second protruding bending portions, and the protruding portion are not disposed in one straight line.

18. The mount structure for the ceramic electronic component according to claim 10, wherein
each of the first and second mount portions has a circular or substantially circular shape; and
each of the first and second protruding bending portions is defined by a semispherical or substantially semispherical protruding bending portion that protrudes toward the mounting surface of the mounting substrate at a central portion of the respective first and second mount portions.

19. The mount structure for the ceramic electronic component according to claim 10, wherein
each of the first and second mount portions has an elliptical or substantially elliptical shape; and
each of the first and second protruding bending portions is defined by an ellipsoidal or substantially ellipsoidal protruding bending portion that protrudes toward the mounting surface of the mounting substrate at a central portion of the respective first and second mount portions.

\* \* \* \* \*